United States Patent
Ohta

(10) Patent No.: US 6,819,788 B2
(45) Date of Patent: Nov. 16, 2004

(54) FAILURE ANALYSIS METHOD THAT ALLOWS HIGH-PRECISION FAILURE MODE CLASSIFICATION

(75) Inventor: Fumihito Ohta, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 78 days.

(21) Appl. No.: 10/288,519

(22) Filed: Nov. 6, 2002

(65) Prior Publication Data

US 2003/0221148 A1 Nov. 27, 2003

(30) Foreign Application Priority Data

May 22, 2002 (JP) .................................. 2002-147478

(51) Int. Cl.[7] .................................................. G06K 9/00
(52) U.S. Cl. .......................... 382/145; 714/723; 438/14
(58) Field of Search ................................ 382/145–150, 382/232–243; 714/738, 723, 718–719, 710, 7, 42; 365/200–201; 324/210–211, 216; 348/86–87, 92–95, 126–130; 438/10, 14, 17, 21, 26

(56) References Cited

U.S. PATENT DOCUMENTS

| | | | | |
|---|---|---|---|---|
| 5,644,578 A | * | 7/1997 | Ohsawa | 714/719 |
| 5,828,778 A | * | 10/1998 | Hagi et al. | 382/145 |
| 5,907,515 A | * | 5/1999 | Hatakeyama | 365/200 |
| 6,016,278 A | * | 1/2000 | Tsutsui et al. | 365/200 |
| 6,564,346 B1 | * | 5/2003 | Vollrath et al. | 714/723 |

* cited by examiner

*Primary Examiner*—Leo Boudreau
*Assistant Examiner*—Ishrat Sherali
(74) *Attorney, Agent, or Firm*—Oblon, Spivak, McClelland, Maier & Neustadt, P.C.

(57) ABSTRACT

A failure analysis method is provided that allows high-precision failure mode classification. Based on the result of a predetermined test using an LSI tester (2), an original FBM (27a) is generated. The FBM (27a) is compressed with 8×8 bits per pixel to generate an FBM (27b). Based on the FBM (27b), an area where a failure bit exists in the FBM (27a) is determined. Then, by compressing a portion of the FBM (27a) which corresponds to the above area with 2×2 bits per pixel, FBMs (27c, 27d) are generated. Based on the FBMs (27c, 27d), failure bits are determined.

16 Claims, 37 Drawing Sheets

FIG. 6

```
RECOGNITION RULE

Compress ratio: 8×8 bits ——18
    (
            Fail mode name: A-line-Fail ——19
            Scan No: 1 ——20
            Fail size: 4×1 pixels ——21
            Cross: None ——22
            Fail rate: 100% ——23
            Scan size: 4×1 pixels ——24
            Multi step recognition: ON ——25
            Multi step recognition rule: ——26
                    Compress ratio: 2×2 bits ——18a
                    (
                            Fail mode name: A-line-Fail ——19a
                            Scan No: 1 ——20a
                            Fail size: 16×1 pixels ——21a
                            Cross: None ——22a
                            Fail rate: 100% ——23a
                            Scan size: 16×1 pixels ——24a
                            Multi step recognition: OFF ——25a
                    )
                    (
                            Fail mode name: Bit-Fail ——19b
                            Scan No: 2 ——20b
                            Fail size: 1×1 pixels ——21b
                            Cross: None ——22b
                            Fail rate: 100% ——23b
                            Scan size: 1×1 pixels ——24b
                            Multi step recognition: OFF ——25b
                    )
    )
    (
            Fail mode name: B-line-Fail
            Scan No: 2
            Fail size: 1×4 pixels
            Cross: None
                    •
                    •
                    •
```

F I G. 8
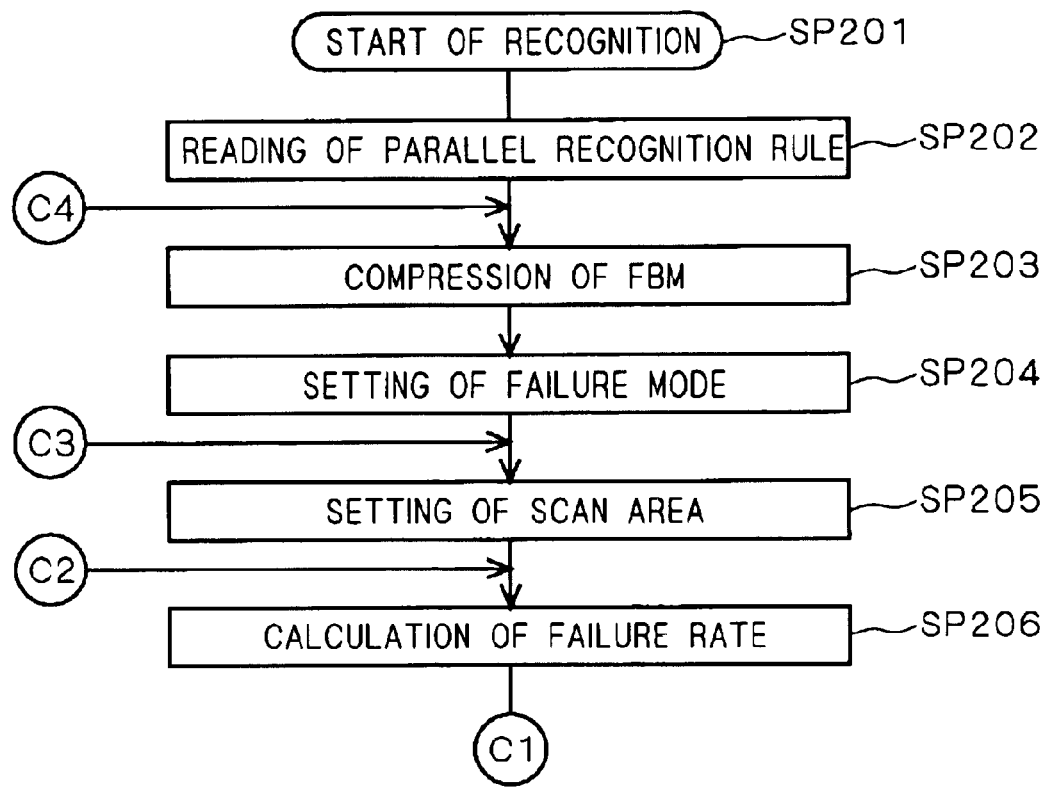

F I G. 10

```
RECOGNITION RULE
[
        Compress ratio: 32×1 bits ——18
        Compress threshold: 16bits ——32a
        (
                Fail mode name: A-line-Fail ——19
                Scan No: 1 ——20
                Fail size: 1×2 pixels ——21
                Cross: None ——22
                Fail rate: 100% ——23
                Scan size: 1×2 pixels ——24
        )
        (
                Fail mode name: B-line-Fail
                Scan No: 2
                Fail size: 1×1 pixels
                Cross: None
                    •
                    •
                    •
]
[
        Compress ratio: 2×2 bits
        Compress threshold: 1bits ——32b
        (
                Fail mode name: Bit-Fail
                Scan No: 1
                Fail size: 1×1 pixels
                Cross: None
                Fail rate: 100%
                Scan size: 1×1 pixels
        )
]
```

Group 33 encloses the first block; group 34 encloses the second block.

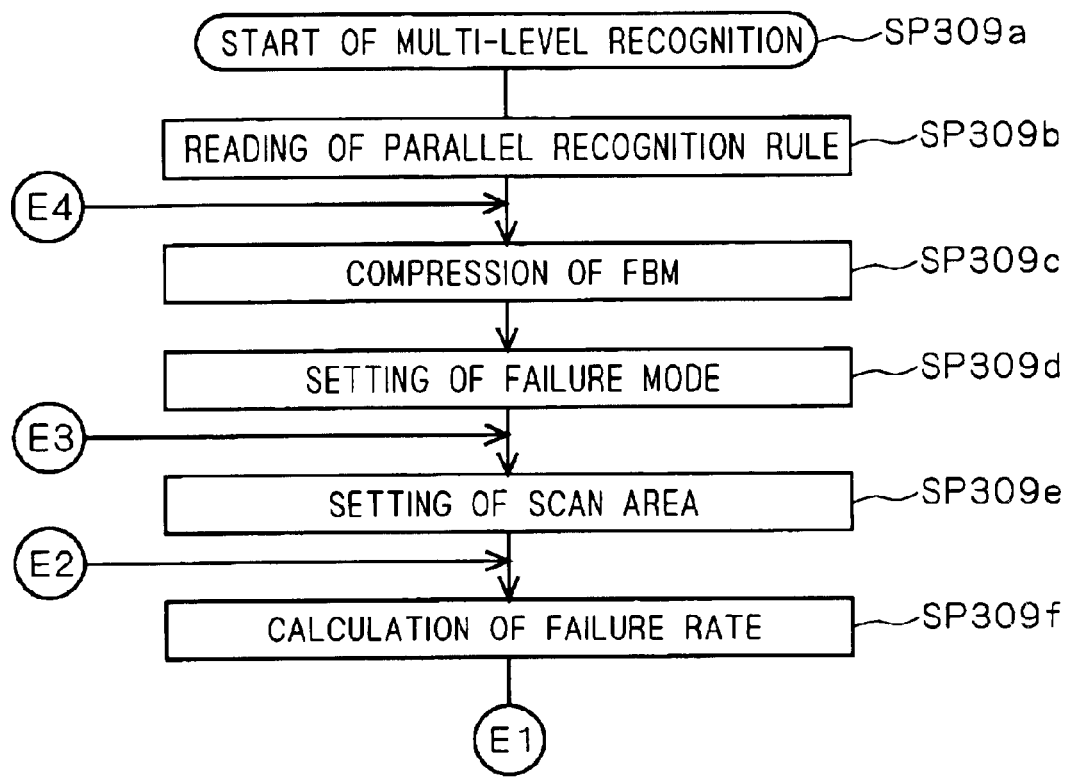
F I G. 14

FIG. 16

```
RECOGNITION RULE
[
        Compress ratio: 8×8 bits
        Compress threshold: 1bits
        (
                Fail mode name: A-line-Fail
                Scan No: 1
                Fail size: 4×1 pixels
                Cross: None
                Fail rate: 100%
                Scan size: 4×1 pixels
                Multi step recognition: ON
                Multi step recognition rule:
                [
                        Compress ratio: 32×1 bits
                        Compress threshold: 16bits
                        (
                                Fail mode name: A-line-Fail
                                Scan No: 1
                                Fail size: 1×2 pixels
                                Cross: None
                                Fail rate: 100%
                                Scan size: 1×2 pixels
                                Multi step recognition: OFF
                        )
                ]
                [
                        Compress ratio: 2×2 bits
                        Compress threshold: 2bits
                        (
                                Fail mode name: Bit-Fail
                                Scan No: 2
                                Fail size: 1×1 pixels
                                Cross: None
                                Fail rate: 100%
                                Scan size: 1×1 pixels
                                Multi step recognition: OFF
                        )
                ]
        )
        (
                Fail mode name: B-line-Fail
                Scan No: 2
```

(first inner block marked ~35, second inner block marked ~36)

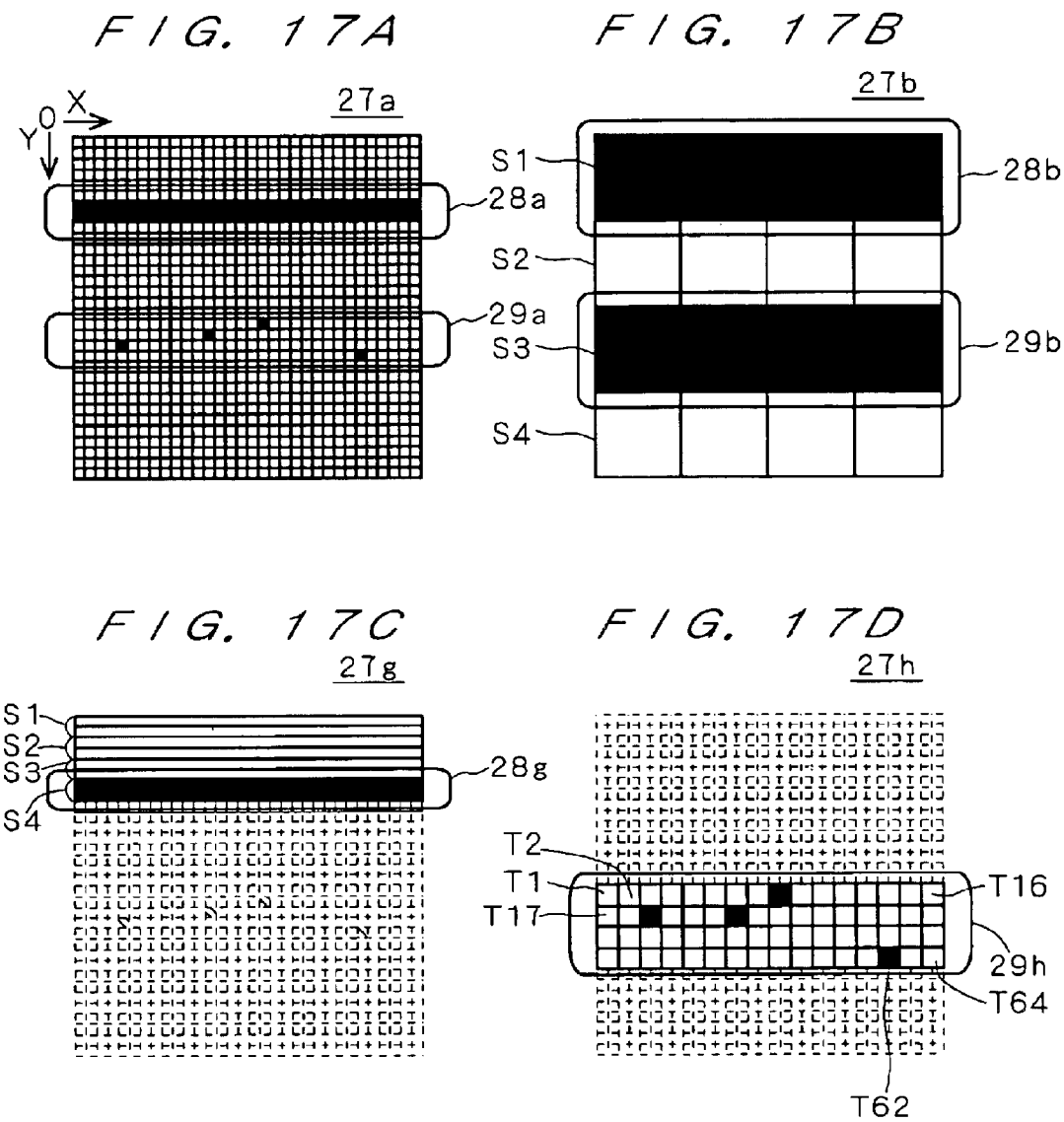

FIG. 28

```
RECOGNITION RULE

[
        Compress ratio: 4×1 bits ——18
        Compress threshold: 1bits ——32
        Additional compress ratio: 8×1 pixels ——40
        Compress threshold: 4 pixels ——41

(
        Fail mode name: A-line-Fail——19
        Scan No: 1 ——20
        Fail size: 1×1 pixels ——21
        Cross: None ——22
        Fail rate: 100% ——23
        Scan size: 1×1 pixels ——24
    (
            •
            •
            •
```

F / G. 30

```
RECOGNITION RULE

[
  Compress ratio: 4×4 bits ——18
  Compress threshold: 1bits ——32

(
          Fail mode name: A-line-Fall ——19
          Scan No: 1——20
          Fail size: 5,6,5×1 pixels——45
          Cross: None ——22
          Fail rate: 100%——23
          Scan size: 5,6,5×1 pixels ——46
  )
        •
        •
        •
```

FIG. 32

```
RECOGNITION RULE

X-Block: 20,24,20 bits ——49

[
        Compress ratio: 4×4 bits ——18
        Compress threshold: 1bits ——32

(
            Fail mode name: A-line-Fall ——19
            Scan No: 1 ——20
            Fail size: (X-Block/4)×1 pixels ——45a
            Cross: None ——22
            Fail rate: 100% ——23
            Scan size: (X-Block/4)×1 pixels ——46a
    )
        •
        •
        •
```

FIG. 33

```
RECOGNITION RULE

[
 Compress ratio: 10,10,12,12,10,10×4 bits ——50
 Compress threshold: 1bits ——32

(
            Fail mode name: A-line-Fall ——19
            Scan No: 1 ——20
            Fail size: 2×1 pixels ——21
            Cross: None ——22
            Fail rate: 100% ——23
            Scan size: 2×1 pixels ——24
    )
        •
        •
        •
```

FIG. 35

```
RECOGNITION RULE

X-Block: 20,24,20 bits ——49

[
            Compress ratio: (X-Block/2)×4 bits ——51
            Compress threshold: 1bits ——32

(
                    Fail mode name: A-line-Fall ——19
                    Scan No: 1——20
                    Fail size: 2×1 pixels ——21
                    Cross: None——22
                    Fail rate: 100%——23
                    Scan size: 2×1 pixels——22
            )
                    •
                    •
                    •
```

FIG. 36

```
RECOGNITION RULE

[
 Compress ratio: 8×8 bits ——18
 Compress threshold: 1bits ——32

(
        Fail mode name: A-line-Fall  ——19
        Scan No: 1——  20
        Fail size: 4×1 pixels ——21
        Cross: Special ——22                                    ——52
        Cross threshold: up=0-1 pixels,down=0-1 pixels,right=OK,left=OK
        Fail rate: 100%  ——23
        Scan size: 2×1 pixels ——24
 )
        •
        •
        •
```

F/G. 39

```
RECOGNITION RULE

Recognized area: 16×16 bits ——59
        Recognized area start point:(0,0) ——60
  [
        Compress ratio: 2×2 bits ——18
        Compress threshold: 1bits ——32

(
                Fail mode name: Bit-Fail ——19
                Scan No: 1 ——20
                Fail size: 1×1 pixels ——21
                Cross: None ——22
                Fail rate: 100% ——23
                Scan size: 1×1 pixels ——24
        )
                •
                •
                •
```

FAILURE ANALYSIS METHOD THAT ALLOWS HIGH-PRECISION FAILURE MODE CLASSIFICATION

BACKGROUND OF THE INVENTION

1. Field of the Invention

The present invention relates to a failure analysis method, especially for memory LSIs.

2. Description of the Background Art

Generally, memory LSIs have a memory cell array having a pattern in which a plurality of memory cells are arranged in a matrix. One of conventionally known failure analysis methods for such memory LSIs is to use an LSI tester.

Hereinbelow, a brief outline of the conventional failure analysis methods will be described. First, using an LSI tester, all memory cells are tested for electrical characteristics. According to the test results, a first FBM (fail bit map) is generated. The first FBM has a pattern in which, in an X-Y coordinate space where row and column directions are defined respectively as X and Y directions, a plurality of bits are arranged in a matrix in correspondence with the pattern of a memory cell array.

The first FBM is then compressed with a predetermined compression ratio to generate a second FBM. When the first FBM is compressed with, for example, 8×8 bits per pixel, 64 bits (8 bits in the X direction×8 bits in the Y direction) in the first FBM correspond to one pixel in the second FBM. If any one of the 64 bits is a failure bit, a pixel corresponding to those 64 bits is set as a defective pixel, whereas if none of the 64 bits are failure bits, the pixel corresponding to the 64 bits is set as a non-defective pixel.

Then, according to a pattern of defective pixels in the second FBM, a process for recognizing the types of failures is performed. Thereby, failures are classified into several failure modes such as block, line and bit failures. Then, for each of the failure modes in the classification, a recognition process is performed based on the first FBM on a bit by bit basis, thereby to obtain detailed failure information (such as addresses and sizes).

According to the conventional failure analysis methods, however, the compression ratio in compressing the first FBM into the second FBM is a fixed value and is set somewhat higher (about 8×8 bits per pixel) in order to reduce the amount of data to be processed. Thus, depending on the conditions of a distribution of failure bits, failure mode classification may not be performed properly.

SUMMARY OF THE INVENTION

An object of the present invention is to provide a failure analysis method that allows high-precision failure mode classification.

According to an aspect of the present invention, the failure analysis method comprises the following steps (a) to (e). The step (a) is to generate a first FBM (Fail Bit Map) having a pattern in which a plurality of bits are arranged in a matrix, based on a result of a predetermined test on an object to be tested. The step (b) is to generate a second FBM by compressing the first FBM with a first compression ratio. The step (c) is to determine an area where a failure bit exists in the first FBM, based on the second FBM. The step (d) is to generate a third FBM by compressing a portion of the first FBM which corresponds to the area, with a second compression ratio lower than the first compression ratio. The step (e) is to determine the failure bit based on the third FBM.

The determination of failure bits is performed not based on the rough second FBM but based on the third FBM finer than the second FBM. This allows high-precision determination of failure bits.

Besides, the third FBM is generated by compressing only a portion of the first FBM which corresponds to an area where a failure bit exists with a second compression ratio, rather than by merely reducing the first compression ratio. This minimizes an increase in the amount of data to be processed, thereby preventing a considerable extension of the time required for recognition.

According to another aspect of the present invention, the failure analysis method comprises the following steps (a) to (e). The step (a) is to generate a first FBM (Fail Bit Map) having a pattern in which a plurality of bits are arranged in a matrix, based on a result of a predetermined test on an object to be tested. The step (b) is to generate a second FBM having a first pattern by compressing the first FBM. The step (c) is to generate a third FBM having a second pattern different from the first pattern, by compressing the first FBM. The step (d) is to determine a first failure based on the second FBM. The step (e) is to determine a second failure based on the third FBM.

By compressing the first FBM to generate the second and third FBMs having different patterns, the first and second failures can be determined individually. For example, a line failure (first failure) can be determined based on the second FBM having the first pattern in which a plurality of strip pixels are arranged, while a bit failure (second failure) can be determined based on the third FBM having the second pattern in which a plurality of pixels are arranged in a matrix.

According to still another aspect of the present invention, the failure analysis method comprises the following steps (a) to (g). The step (a) is to generate a first FBM (Fail Bit Map) having a pattern in which a plurality of bits are arranged in a matrix, based on a result of a predetermined test on an object to be tested. The step (b) is to generate a second FBM by compressing the first FBM with a first compression ratio. The step (c) is to determine an area where a failure bit exists in the first FBM, based on the second FBM. The step (d) is to generate a third FBM having a first pattern by compressing a portion of the first FBM which corresponds to the area. The step (e) is to generate a fourth FBM having a second pattern different from the first pattern, by compressing a portion of the first FBM which corresponds to the area. The step (f) is to determine a first failure based on the third FBM. The step (g) is to determine a second failure based on the fourth FBM.

By compressing the first FBM to generate the third and fourth FBMs having different patterns, the first and second failures can be determined individually. For example, a line failure (first failure) can be determined based on the third FBM having the first pattern in which a plurality of strip pixels are arranged, while a bit failure (second failure) can be determined based on the fourth FBM having the second pattern in which a plurality of pixels are arranged in a matrix.

Besides, generating the third and fourth FBMs for only a portion corresponding to the area where a failure bit exists minimizes an increase in the amount of data to be processed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram illustrating a recognition rule of the failure analysis method according to the first preferred embodiment of the present invention;

FIGS. 8 and 9 are flow charts for explaining a failure analysis method according to a second preferred embodiment of the present invention;

FIG. 10 is a diagram illustrating a recognition rule of the failure analysis method according to the second preferred embodiment of the present invention;

FIGS. 12 to 15 are flow charts for explaining a failure analysis method according to a third preferred embodiment of the present invention;

FIG. 16 is a diagram illustrating a recognition rule of the failure analysis method according to the third preferred embodiment of the present invention;

FIGS. 17A to 17D are diagrams illustrating FBMs in the failure analysis method according to the third preferred embodiment of the present invention;

FIG. 28 is a diagram illustrating a recognition rule of a failure analysis method according to a seventh preferred embodiment of the present invention;

FIG. 30 is a diagram illustrating a recognition rule of a failure analysis method according to an eighth preferred embodiment of the present invention;

FIG. 32 is a diagram illustrating a recognition rule of a failure analysis method according to a ninth preferred embodiment of the present invention;

FIG. 33 is a diagram illustrating a recognition rule of a failure analysis method according to a tenth preferred embodiment of the present invention;

FIG. 35 is a diagram illustrating a recognition rule of a failure analysis method according to an eleventh preferred embodiment of the present invention;

FIG. 36 is a diagram illustrating a recognition rule of a failure analysis method according to a twelfth preferred embodiment of the present invention;

FIG. 39 is a diagram illustrating a recognition rule of a failure analysis method according to a fourteenth preferred embodiment of the present invention.

DESCRIPTION OF THE PREFERRED EMBODIMENTS

Hereinbelow, using a memory LSI as an example of the object to be tested, a failure analysis device and method according to the present invention will be described.

Figure 1:
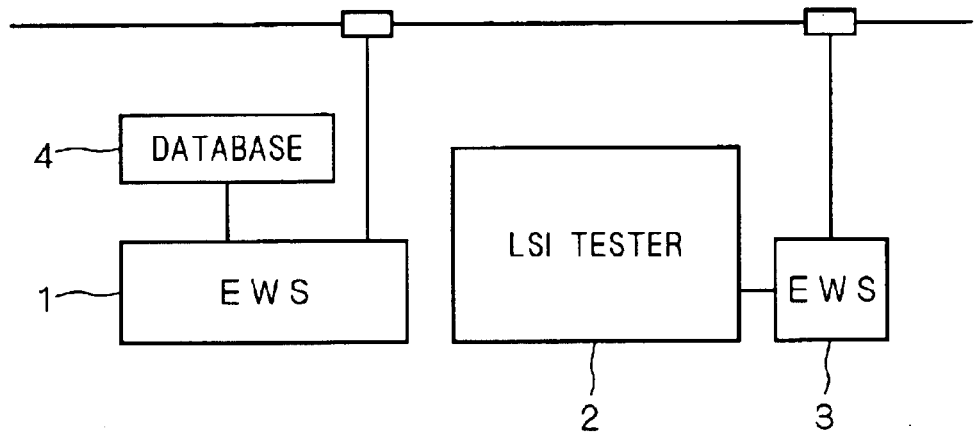
FIG. 1 is a block diagram showing a configuration of a failure analysis device according to the present invention.
Figure 2:
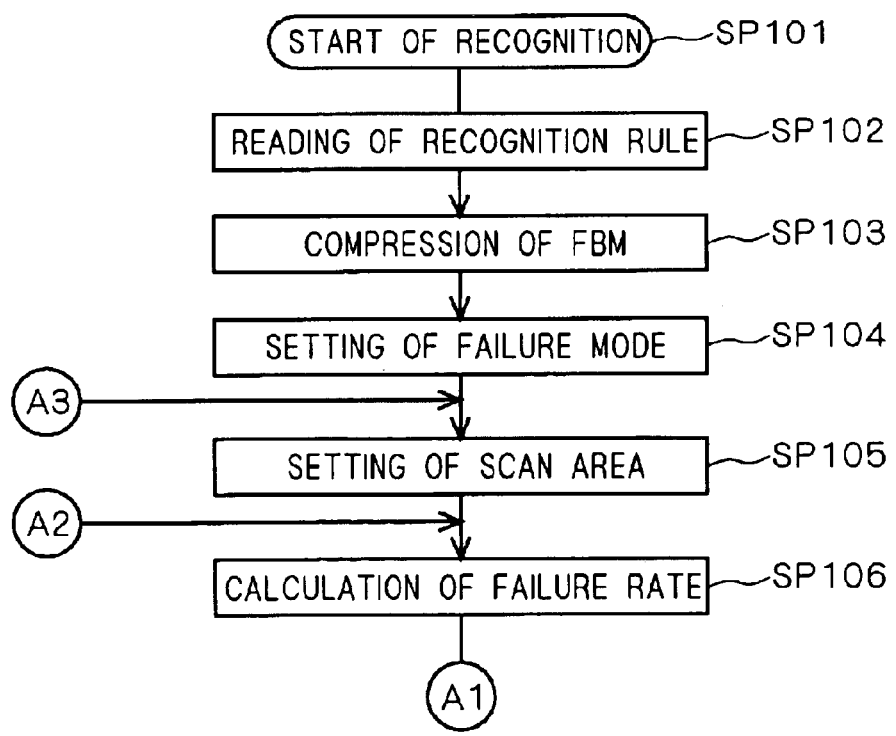
FIGS. 2 to 5 are flow charts for explaining a failure analysis method according to a first preferred embodiment of the present invention.

FIG. 1 is a block diagram showing a configuration of the failure analysis device according to the present invention. As shown in FIG. 1, the failure analysis device according to the present invention has an LSI tester 2 for conducting an electrical characteristic test on every memory cell in a memory LSI, an EWS (Engineering Work Station) 3 for controlling the operation of the LSI tester 2 and obtaining the results of test by the LSI tester 2, an EWS 1 which is connected with the LSI tester 2 through networks and the EWS 3 and which has the function of performing the failure analysis method according to the present invention based on the results of test by the LSI tester 2, and a database 4 referred to by the EWS 1.

Hereinbelow, preferred embodiments of the failure analysis method according to the present invention, using the failure analysis device shown in FIG. 1, will be described in detail.

First Preferred Embodiment

FIGS. 2 to 5 are flow charts for explaining a failure analysis method according to a first preferred embodiment of the present invention. FIG. 6 is a diagram illustrating a recognition rule of the failure analysis method according to the first preferred embodiment. FIGS. 7A to 7D are diagrams respectively illustrating FBMs 27a to 27d in the failure analysis method according to the first preferred embodiment. The recognition rule has been generated for each variety and previously registered in the database 4.

As shown in FIG. 6, the recognition rule of the failure analysis method according to the first preferred embodiment contains items 18 and 18a regarding the compression ratio in compressing FBMs, items 19, 19a and 19b regarding the names of failure modes for use in classification, items 20, 20a and 20b regarding the priority (scan number) of a failure mode to be recognized, items 21, 21a and 21b regarding the size (X×Y pixels) of failures corresponding to each failure mode, items 22, 22a and 22b regarding a neighbor condition later to be described, items 23, 23a and 23b regarding the failure rate, items 24, 24a and 24b regarding the scan size (X×Y pixels) corresponding to each failure mode, items 25, 25a and 25b regarding the setting of whether multi-level recognition is to be performed, and an item 26 as a prefix to a multi-level recognition rule.

In judging whether a specific defective pixel corresponds to a failure in a specific failure mode, when the above items 22, 22a and 22b regarding the neighbor condition are set to "None" and if there is another defective pixel around the specific defective pixel, the specific defective pixel is not recognized as a failure in the specific failure mode. On the other hand, when the items 22, 22a and 22b are set to "OK", even if there is another defective pixel around the specific defective pixel, the specific defective pixel is recognized as a failure in the specific failure mode. Under the recognition rule shown in FIG. 6, however, the items 22, 22a and 22b are all set to "None".

Referring now to FIGS. 1 to 7, the failure analysis method according to the first preferred embodiment will be described. A test on the memory LSI using the LSI tester 2 has already been completed and the test result has been registered in the database 4. The EWS1 has already generated the original FBM 27a shown in FIG. 7A based on the test result read from the database 4, and the FBM 27a has been registered in the database 4. Referring to FIG. 7A, the FBM 27a has a pattern in which, in an X-Y coordinate space where row and column directions are defined respectively as X and Y directions and an origin point O (where X and Y coordinates are both zero) is set at the upper left corner, 1024 (32×32) bits are arranged in a matrix in correspondence with the pattern of a memory cell array. The FBM 27a contains two line failures 28a and four bit failures 29a.

When failure recognition starts in step SP101, in step SP102, the EWS 1 reads the recognition rule shown in FIG. 6 from the database 4.

In step SP103, the EWS 1 compresses the already generated original FBM 27a based on the contents of the recognition rule shown in FIG. 6. More specifically, the EWS 1 compresses the original FBM 27a with 8×8 bits per pixel, based on the contents of the item 18 on the recognition rule shown in FIG. 6, thereby to generate the FBM 27b shown in FIG. 7B. The FBM 27b has a total of 16 pixels, specifically 4 pixels in the X direction×4 pixels in the Y direction. One pixel in the FBM 27b corresponds to 64 bits (8 bits in the X direction×8 bits in the Y direction) in the FBM 27a. If any one of 64 bits in the FBM 27a is a failure bit, a pixel in the FBM 27b, which corresponds to those 64 bits, is set as a defective pixel (displayed in black), whereas if none of the 64 bits are failure bits, the pixel corresponding to the 64 bits is set as a non-defective pixel (displayed in white). The FBM 27b contains four defective pixels 28b and four defective pixels 29b within the total of 16 pixels.

In step SP104, the EWS 1 sets a first failure mode based on the contents of the recognition rule shown in FIG. 6. In the present example, the item 19, "A-line-Fail", whose scan number, or the item 20, is set to "1" is set as the first failure mode.

In step SP105, the EWS 1 sets a first scan area based on the contents of the recognition rule shown in FIG. 6. More specifically, the EWS 1 sets an area of a size determined by the item 21 on the recognition rule shown in FIG. 6, in the FBM 27b from the side closer to the origin point O. In the present example, a 4- by 1-pixel scan area S1 is set as the first scan area.

In step SP106, the EWS 1 calculates a failure rate in the scan area S1. In the present example, since all four pixels in the scan area S1 are the defective pixels 28b, the failure rate is calculated to be 100%.

In step SP107, the EWS 1 judges whether or not the scan area S1 satisfies predetermined criteria of judgment. More specifically, the EWS 1 judges whether or not the scan area S1 satisfies the neighbor condition and the failure rate requirement, based on the contents of the items 22 and 23 on the recognition rule shown in FIG. 6. In the present example, since the failure rate calculated in step SP106 is 100%, the failure rate requirement of the item 23 is satisfied. Further, since the FBM 27b contains no defective pixels in adjacent areas of the scan area S1 with respect to the Y direction, the neighbor condition of the item 22 is also satisfied. Thus, the result of the judgment in step SP107 is "Yes".

In step SP108, the EWS 1 judges whether a multi-level recognition rule is set or not. In the present example, since the item 25 on the recognition rule shown in FIG. 6 is set to "ON", the multi-level recognition rule is judged to be set. That is, the result of the judgment in step SP108 is "Yes".

Figure 4:
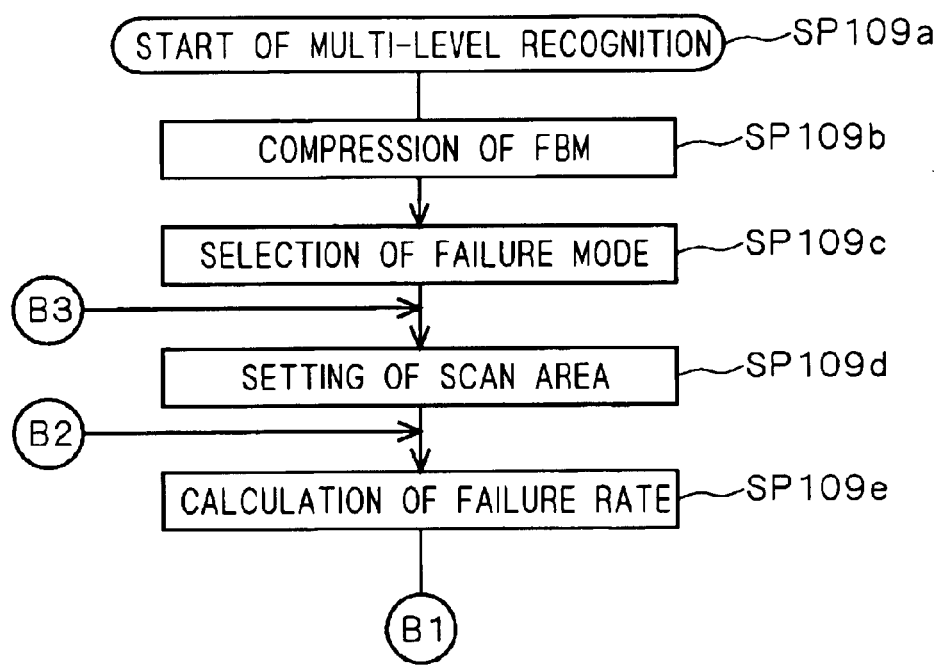
Figure 5:
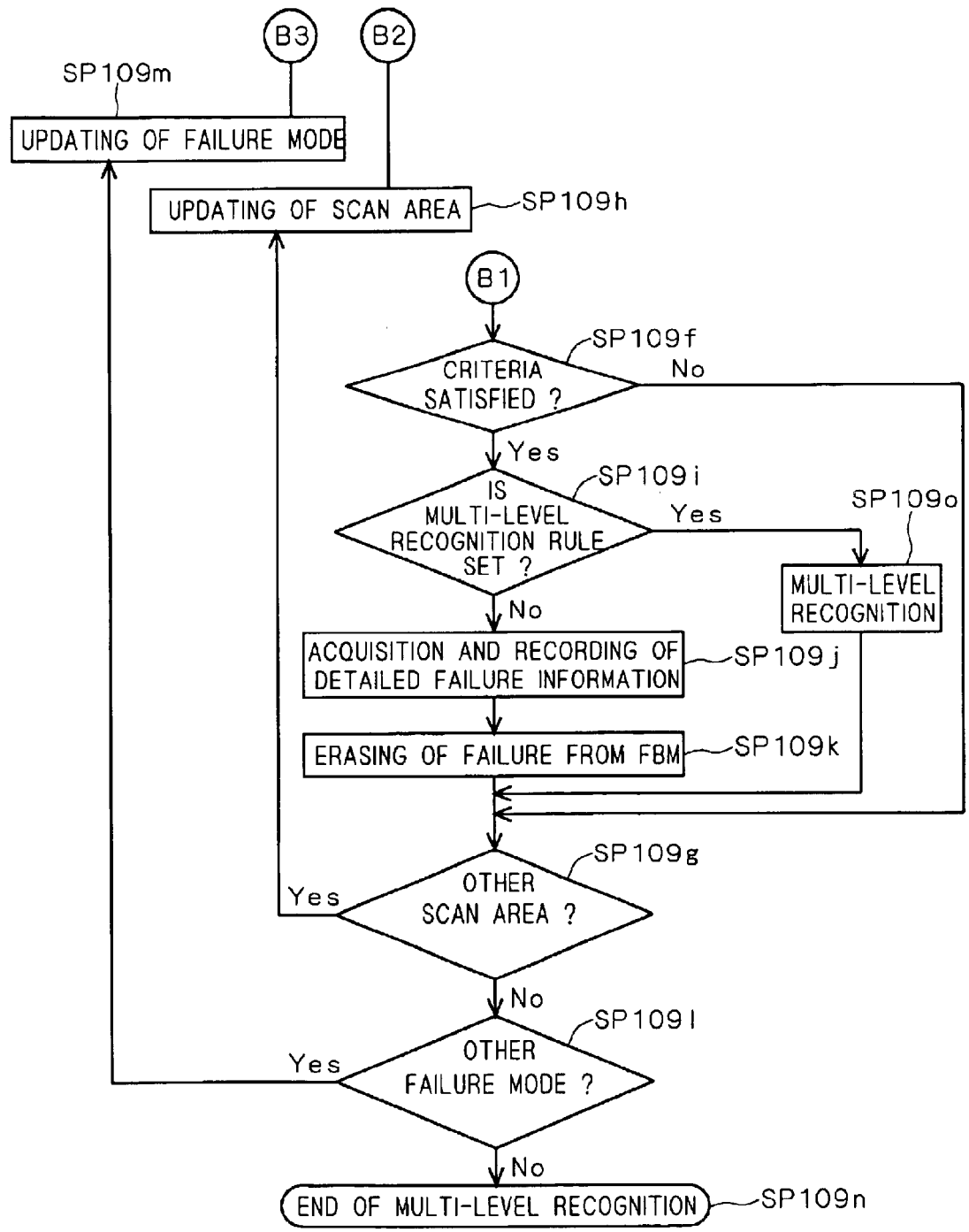

In step SP109, multi-level recognition is made. FIGS. 4 and 5 specifically illustrates a process flow of the multi-level recognition in step SP109. When the multi-level recognition process starts in step SP109a, in step SP109b, the EWS 1 compresses a portion of the original FBM 27a which corresponds to the scan area S1 with 2×2 bits per pixel, based on the contents of the item 18a on the multi-level recognition rule 26, thereby to generate the FBM 27c shown in FIG. 7C. One pixel in the FBM 27c corresponds to 4 bits (2 bits in the X direction×2 bits in the Y direction) in the FBM 27a. The FBM 27c contains a total of 16 defective pixels 28c corresponding to the line failures 28a in the FBM 27a.

In step SP109c, the EWS 1 sets a first failure mode for the multi-level recognition, based on the contents of the multi-level recognition rule 26. In the present example, the item 19a, "A-line Fail", whose scan number, or the item 20a, is set to "1" is set as the first failure mode for the multi-level recognition.

In step SP109d, the EWS 1 sets a first scan area for the multi-level recognition, based on the contents of the multi-level recognition rule 26. More specifically, the EWS 1 sets an area of a size determined by the item 21a on the multi-level recognition rule 26, in the FBM 27c from the side closer to the origin point O. In the present example, a 16-by 1-pixel scan area T1 is set as the first scan area for the multi-level recognition.

In step SP109e, the EWS 1 calculates a failure rate in the scan area T1. In the present example, since 16 pixels in the scan area T1 are all non-defective pixels, the failure rate is calculated to be 0%.

In step SP109f, the EWS 1 judges whether the scan area Ti satisfies predetermined criteria of judgment. More specifically, the EWS 1 judges whether the scan area T1 satisfies the neighbor condition and the failure rate requirement, based on the contents of the items 22a and 23a on the multi-level recognition rule 26. In the present example, the failure rate calculated in step SP109e is 0% and the failure rate requirement of the item 23a is not satisfied; thus, the result of the judgment in step SP109f is "No".

In step SP109g, the EWS 1 judges whether there remain any other scan areas in the FBM 27c. In the present example, scan areas T2 to T4 remain; thus, the result of the judgment in step SP109g is "Yes".

In step SP109h, the EWS 1 updates a scan area. More specifically, the EWS 1 sets the scan area T2 next to the scan area T1 in the FBM 27c, based on the contents of the item 24a on the multi-level recognition rule 26.

Then, the calculation in step SP109c and the judgment in step SP109f are performed in succession on the scan area T2. In the present example, the failure rate in the scan area T2 is also 0%; thus, the result of the judgment in step SP109f is "No". After judgment in step SP109g, the next scan area T3 is set in step SP109h. Since the failure rate in the scan area T3 is also 0% in the present example, in similar manner, the next scan area T4 is set in step SP109h.

Then, the calculation in step SP109e and the judgment in step SP109f are performed on the scan area T4. In the present example, the failure rate in the scan area T4, calculated in step SP109e, is 100% and thus the failure rate requirement of the item 23a is satisfied. Further, since the FBM 27c contains no other defective pixels in adjacent areas of the scan area T4 with respect to the Y direction, the neighbor condition of the item 22a is also satisfied. Thus, the result of the judgment on the scan area T4 in step SP109f is "Yes".

In step SP109i, the EWS 1 judges whether the multi-level recognition rule is set or not. In the present example, since the item 25a on the multi-level recognition rule 26 is set to "OFF", the multi-level recognition rule is judged not to be set, and thus the result of the judgment in step SP109i is "No".

In step SP109j, the EWS 1 performs a process for recognizing a portion of the FBM 27a which corresponds to the scan area T4 on a bit by bit basis, thereby to obtain detailed failure information (such as addresses and sizes) and to record failure data after classifying failures as the failure mode "A-line-Fail".

In step SP109k, the EWS 1 erases the defective pixels 28c in the scan area T4, which were recognized as the failure mode "A-line-Fail", from the FBM 27c.

In step SP109g, the EWS 1 judges whether there remain any other scan areas in the FBM 27c. In the present example, there remains no scan area; thus, the result of the judgment in step SP109g is "No".

In step SP109l, the EWS 1 judges whether there remain any other failure modes in the multi-level recognition rule 26. In the present example, the item 19b, "Bit-Fail", remains; thus, the result of the judgment in step SP109l is "Yes".

In step SP109m, the EWS 1 updates a failure mode. In the present example, the item 19b, "Bit-Fail", whose scan number, or the item 20b, is set to "2" is set as a second failure mode for the multi-level recognition. Thereafter, recognition in the failure mode "Bit-Fail" is performed on the FBM 27c according to the flow chart shown in FIGS. 4 and 5. In the present example, however, as a result of the erasing of failures in step SP109k, no failure bit remains in the FBM 27c at this time and thus no bit failures are detected in the FBM 27c. After the completion of the recognition of the FBM 27c in the failure mode "Bit-Fail", the judgment in step SP109l is made again. In this case, no failure mode remains in the multi-level recognition rule 26; thus, the result of the judgment in step SP109l is "No". The process then goes to the step SP109n, thereby completing the multi-level recognition of the scan area S1. If the result of the judgment in step SP109i is "Yes", further multi-level recognition is made in step SP109o.

Figure 3:
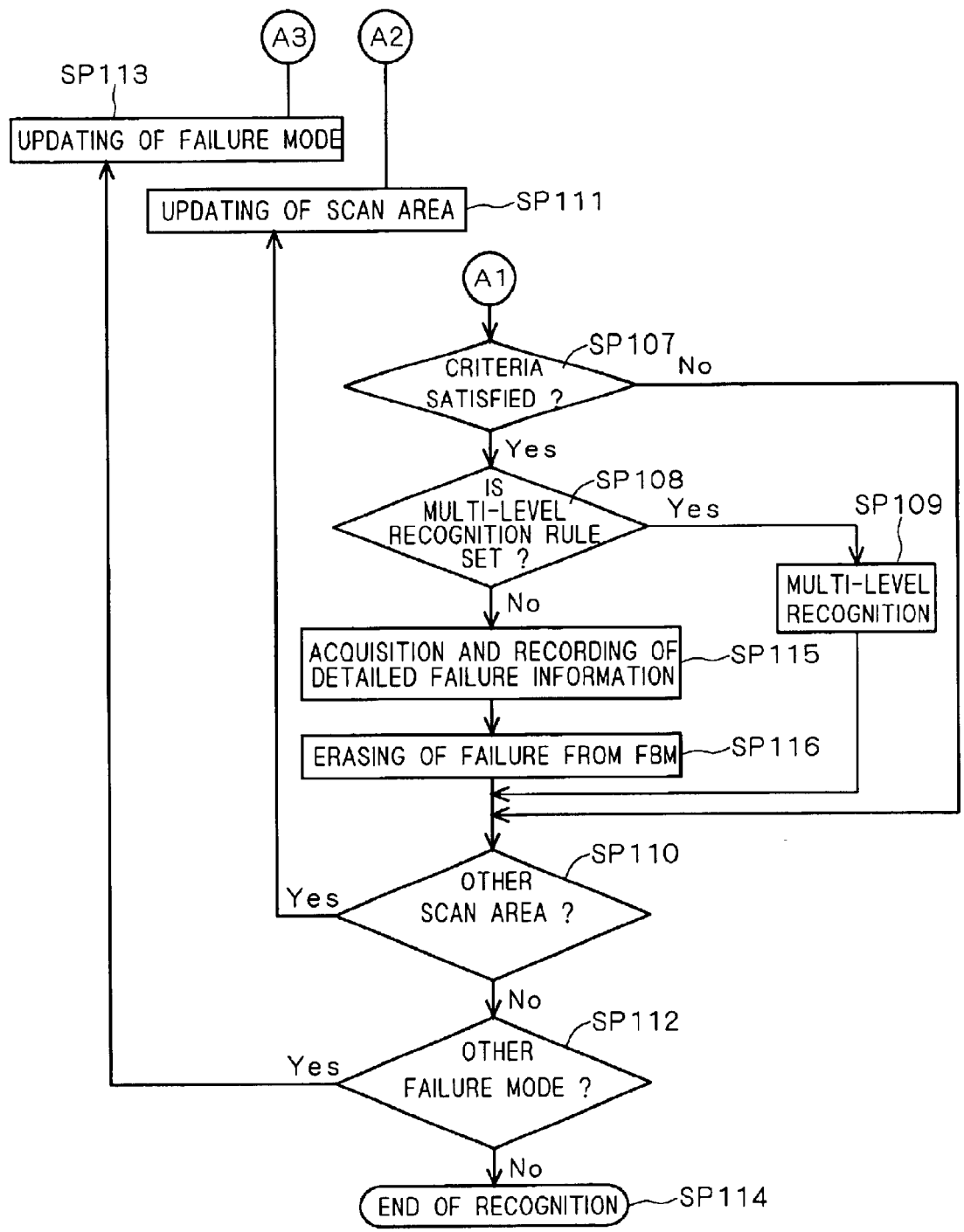

Referring to FIG. 3, after the completion of the multi-level recognition of the scan area S1, in step SP110, the EWS 1 judges whether there remain any other scan areas in the FBM 27b. In the present example, the scan areas S2 to S4 remain; thus, the result of the judgment in step SP110 is "Yes".

In step SP111, the EWS 1 updates a scan area. More specifically, the EWS 1 sets the scan area S2 next to the scan area S1 in the FBM 27b, based on the contents of the item 24 on the recognition rule shown in FIG. 6.

Then, the calculation in step SP106 and the judgment in step SP107 are performed on the scan area S2. In the present example, since the failure rate in the scan area S2 is 0%, the result of the judgment in step SP107 is "No". Thus, after the judgment in step SP110, the next scan area S3 is set in step SP111.

Then, the calculation in step SP106 and the judgment in step SP107 are performed on the scan area S3. In the present example, the failure rate in the scan area S3 is 100% and the failure rate requirement of the item 23 is satisfied. Further, the FBM 27b contains no defective pixels in adjacent areas of the scan area S3 with respect to the Y direction and the neighbor condition of the item 22 is also satisfied. Thus, the result of the judgment on the scan area S3 in step SP107 is "Yes".

In step SP108, the EWS 1 judges whether the multi-level recognition rule is set or not. In the present example, the result of the judgment in step SP108 is "Yes" and the multi-level recognition shown in FIGS. 4 and 5 is made in step SP109 in the manner as above described. As for the scan area S3, the process proceeds to the step SP109l with no line failure recognized in the first failure mode "A-line-Fail" for the multi-level recognition. Then, in step SP109m, the item 19b, "Bit-Fail", is set as a second failure mode for the multi-level recognition.

Figure 7A:
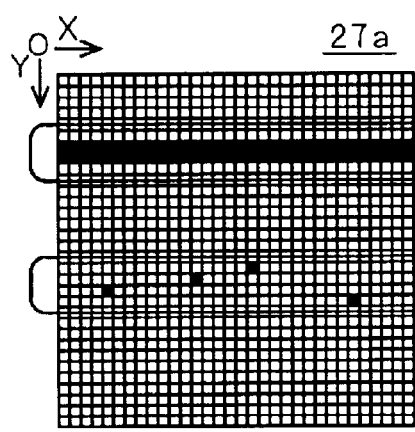
FIGS. 7A to 7D are diagrams illustrating FBMs in the failure analysis method according to the first preferred embodiment of the present invention.
Figure 7B:
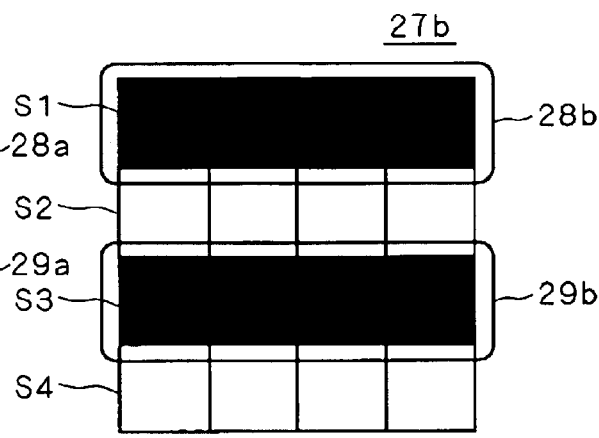
Figure 7C:
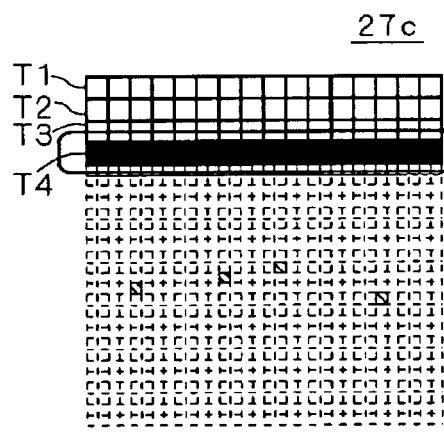
Figure 7D:
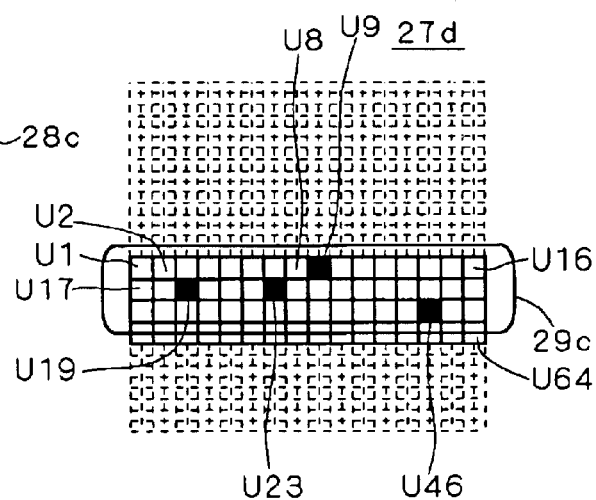

In step SP109d, based on the contents of the item 21b on the multi-level recognition rule 26, the EWS 1 sets a first scan area U1 in the failure mode "Bit-Fail" for the multi-level recognition, in the FBM 27d shown in FIG. 7D.

In step SP109e, the EWS 1 calculates a failure rate in the scan area U1. In the present example, the failure rate in the scan area U1 is calculated to be 0%. Thus, after passing through the steps SP109f and SP109g, the next scan area U2 is set in step SP109h. After the updating of a scan area is repeated until the scan area U8 in similar fashion, a scan area U9 is set. As for the scan area U9 in the present example, the failure rate calculated in step SP109e is 100% and the failure rate requirement of the item 23b is satisfied. Further, there exist no defective pixels around the scan area U9 and the neighbor condition of the item 22b is also satisfied. Thus, the result of the judgment on the scan area U9 in step SP109f is "Yes".

If the result of the judgment in step SP109i is "No", in step SP109j, the EWS 1 performs a process for recognizing a portion of the FBM 27a which corresponds to the scan area U9 on a bit by bit basis, thereby to obtain detailed failure information (such as addresses and sizes) and to record failure data after classifying failures as the failure mode "Bit-Fail".

Then, in step SP109k, the EWS 1 erases the defective pixels 29c in the scan area U9, which were recognized as the failure mode "Bit-Fail", from the FBM 27d.

Thereafter, the updating of scan areas are repeated until U64 in the manner as above described, thereby completing the multi-level recognition of the scan area S3. By that recognition, detailed failure information and failure data on the scan areas U19, U23 and U46 are obtained and recorded after classification of failures as the failure mode "Bit-Fail".

Referring to FIG. 3, after the completion of the multi-level recognition of the scan area S3, in step SP110, the EWS 1 judges whether there remain any other scan areas in the FBM 27b. In the present example, the scan area S4 remains: thus, the result of the judgment in step SP110 is "Yes".

In step SP111, the EWS 1 updates a scan area. More specifically, the EWS 1 sets the scan area S4 next to the scan area S3 in the FBM 27b, based on the contents of the item 24 on the recognition rule shown in FIG. 6.

Then, the calculation in step SP106 and the judgment in step SP107 are performed on the scan area S4. Since the failure rate in the scan area S4 is 0%, the result of the judgment in step SP107 is "No".

In step SP110, the EWS 1 judges whether there remain any other scan areas in the FBM 27b. In the present example, no scan area remains; thus, the result of the judgment in step SP110 is "No".

In step SP112, the EWS 1 judges whether there remain any other failure modes in the recognition rule shown in FIG. 6. In the present example, the failure mode "B-line-Fail" remains; thus, the result of the judgment in step SP112 is "Yes".

In step SP113, the EWS 1 updates a failure mode, whereby "B-line-Fail" whose scan number is set to "2" is set as a second failure mode. Thereafter, although not described, recognition in the failure mode "B-line-Fail" is performed. After recognition in all the failure modes in the recognition rule has completed, i.e., if the result of the judgment in step SP112 is "No", the process goes to step SP114, thereby completing the failure recognition. If the result of the judgment in step SP108 is "No", after acquisition and recording of detailed failure information in step SP115, defective pixels are erased from the FBM in step SP116.

According to the failure analysis method of the first preferred embodiment, the FBM 27b is generated by compressing the original FBM 27a with a first compression ratio (8×8 bits per pixel) and an area where a failure bit exists in the FBM 27a (hereinafter referred to as a "failure area") is determined based on the FBM 27b. Then, a portion of the FBM 27a which corresponds to the failure area is compressed with a second compression ratio (2×2 bits per pixel) lower than the first compression ratio to generate the FBMs 27c and 27d, based on which classification into the respective failure modes is performed and detailed information on failure bits is obtained and recorded. In this way, failure mode classification is performed not based on the rough FBM 27b but based on the FBMs 27c and 27d finer than the FBM 27b, which improves the accuracy of failure mode classification.

Besides, instead of merely reducing the compression ratio in compressing the FBM 27a to obtain the FBM 27b, only a portion of the FBM 27a which corresponds to the failure area is compressed with a lower compression ratio to generate the FBMs 27c and 27d. This minimizes an increase in the amount of data to be processed, thereby preventing a considerable extension of the time required for recognition.

Second Preferred Embodiment

Figure 9:
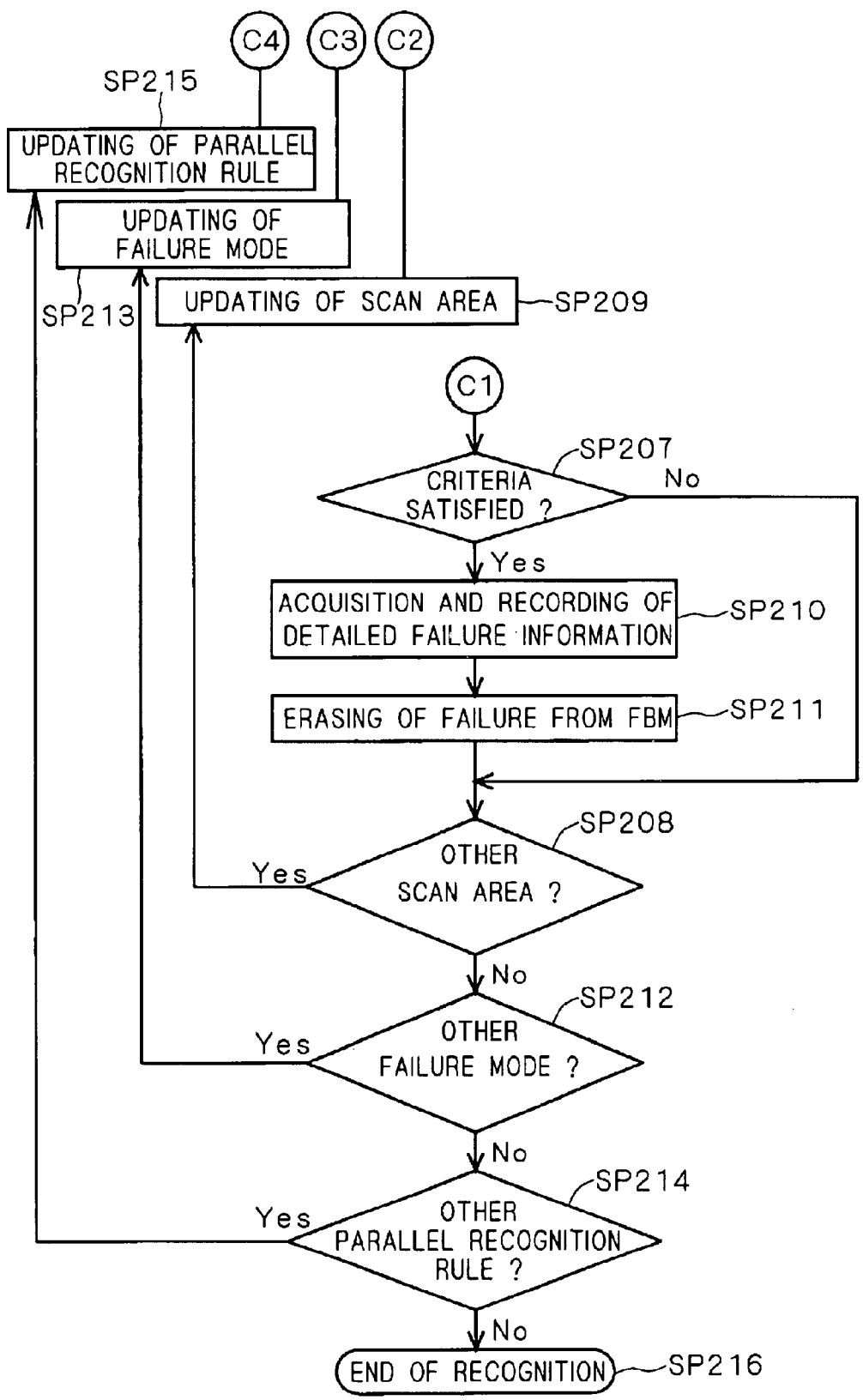
Figure 11A:
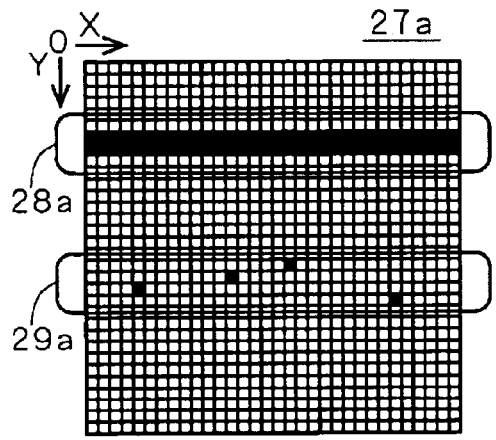
FIGS. 11A to 11C are diagrams illustrating FBMs in the failure analysis method according to the second preferred embodiment of the present invention.
Figure 11B:
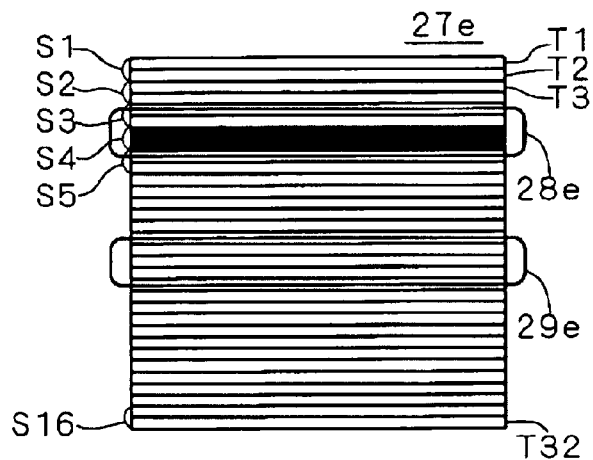
Figure 11C:
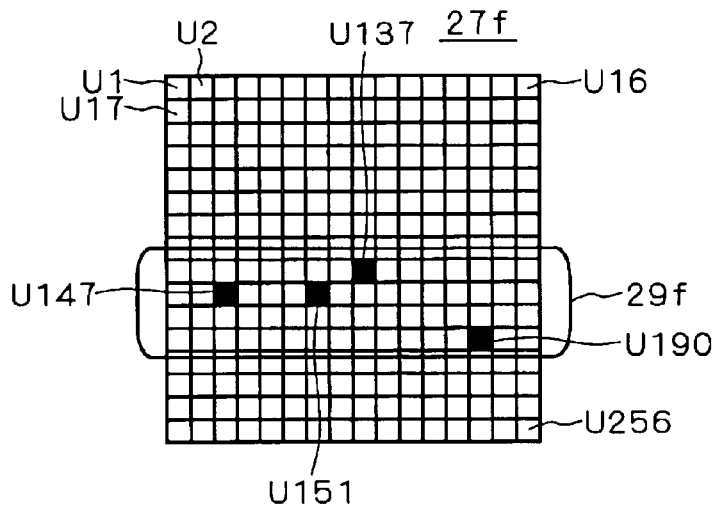
Figure 12:
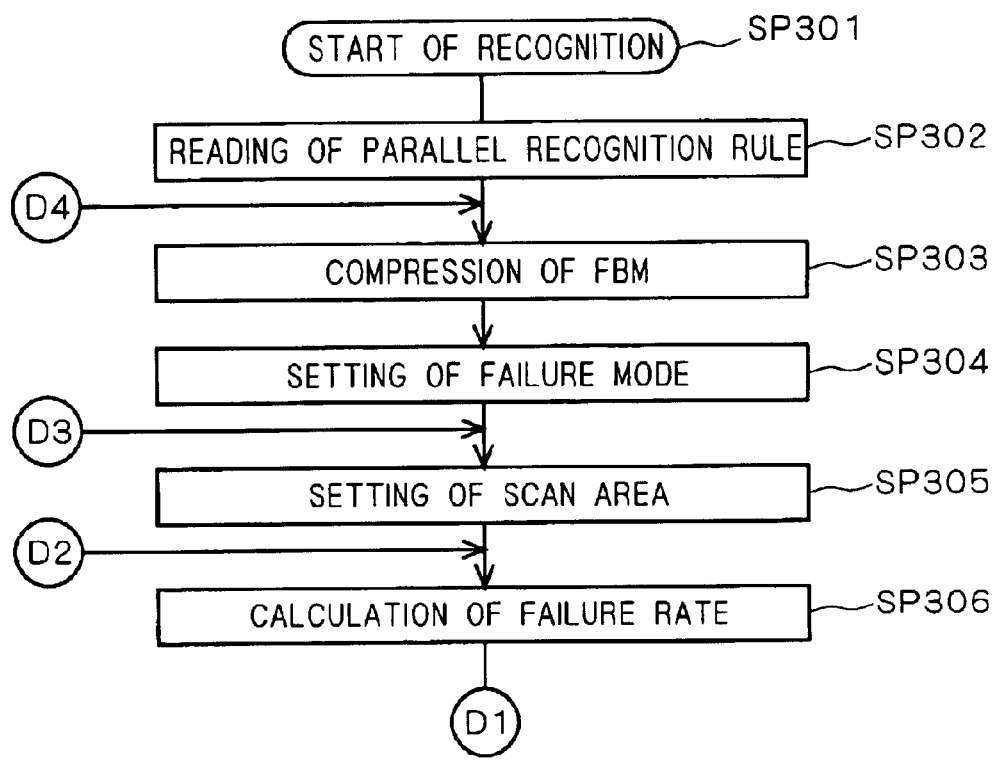

FIGS. 8 and 9 are flow charts for explaining a failure analysis method according to a second preferred embodiment of the present invention. FIG. 10 is a diagram illustrating a recognition rule of the failure analysis method according to the second preferred embodiment. FIGS. 11A to 11C are diagrams respectively illustrating FBMs 27a, 27e and 27f in the failure analysis method according to the second preferred embodiment.

As shown in FIG. 10, the recognition rule of the failure analysis method according to the second preferred embodiment includes a first parallel recognition rule 33 and a second parallel recognition rule 34. The parallel recognition rules 33 and 34 contain items 32a and 32b, respectively, regarding threshold values when the FBMs are compressed.

Hereinbelow, with reference to FIGS. 1, 8 to 10 and 11A to 11C, the failure analysis method according to the second preferred embodiment will be described with the focus on its differences from the failure analysis method according to the first preferred embodiment.

When failure recognition starts in step SP201, in step SP202, the EWS 1 reads the first parallel recognition rule 33 from the database 4.

In step SP203, the EWS 1 compresses the original FBM 27a based on the contents of the parallel recognition rule 33. More specifically, the EWS 1 compresses the FBM 27a with 32×1 bits per pixel based on the contents of the item 18 on the parallel recognition rule 33, thereby to generate the FBM 27e shown in FIG. 11B. The FBM 27e has a total of 32 pixels, specifically 1 pixel in the X direction×32 pixels in the Y direction. One pixel in the FBM 27e corresponds to 32 bits (32 bits in the X direction×1 bit in the Y direction) in the FBM 27a. Referring to the contents of the item 32a on the parallel recognition rule 33, if the FBM 27a contains 16 or more failure bits in a single line (32 bits), the EWS 1 sets a pixel in the FBM 27e, which corresponds to that line, as a defective pixel. On the other hand, if the number of failure bits in a single line is less than 16, a pixel corresponding to that line is set as a non-defective pixel. The FBM 27e contains two defective pixels 28e within the total of 32 pixels. Since the compression threshold value of the item 32a is set to 16 bits, a pixel in the FBM 27e, which corresponds to a line of the FBM 27a where bit failures 29a exist, is not set as a defective pixel.

In step SP204, the EWS 1 sets a first failure mode "A-line-Fail" based on the contents of the items 19 and 20 on the parallel recognition rule 33. Then, in step SP205, the EWS 1 sets the first scan area S1 based on the contents of the item 21 on the parallel recognition rule 33. In step SP206, the EWS 1 calculates a failure rate in the scan area S1. In the present example, the failure rate in the scan area S1 is calculated to be 0%. In step SP207, the EWS 1 judges whether the scan area S1 satisfies predetermined criteria of judgment. In the present example, the result of the judgment in step SP207 is "No". In step SP208, the EWS 1 judges whether there remain any other scan areas in the FBM 27e. In the present example, the result of the judgment in step SP208 is "Yes".

In step SP209, the EWS 1 updates a scan area, whereby the scan area S2 next to the scan area S1 is set in the FBM 27e. Then, the calculation in step SP206 and the judgment in step SP207 are performed in succession on the scan area S2. In the present example, the result of the judgment on the scan area S2 in step SP207 is also "No". After the judgment in step SP208, the next scan area S3 is set in SP209. Since the result of the judgment on the scan area S3 in step SP207 is also "No" in the present example, in similar fashion, the next scan area S4 is set in step SP209.

In step SP206, the EWS 1 calculates a failure rate in the scan area S4. In the present example, both two pixels in the scan area S4 are defective pixels 28e and the failure rate is calculated to be 100%. In step SP207, the EWS 1 judges whether the scan area S4 satisfies predetermined criteria of judgment. In the present example, the result of the judgment in step SP207 is "Yes". In step SP210, the EWS 1 obtains detailed failure information (such as addresses and sizes) on a portion of the FBM 27a which corresponds to the scan area S4 and records failure data after classifying failures as the failure mode "A-line-Fail". The EWS 1 then, in step SP211, erases the defective pixels 28e recognized as the failure mode "A-line-Fail" from the FBM 27e. Also, the EWS 1 erases the line failures 28a recognized as the failure mode "A-line-Fail" from the FBM 27a.

Thereafter, in similar manner, recognition in the failure mode. "A-line-Fail" is made on the other scan areas S5 to S16. Then, after a failure mode is updated in step SP213, recognition in the failure mode "B-line-Fail" is made on scan areas T1 to T32.

In step SP214, the EWS 1 judges whether there remain any other parallel recognition rules in the recognition rule shown in FIG. 10. In the present example, the parallel recognition rule 34 remains; thus, the result of the judgment in step SP214 is "Yes". In step SP215, the EWS 1 updates a parallel recognition rule to set the second parallel recognition rule 34.

In step SP203, the EWS 1 compresses the FBM 27a based on the contents of the parallel recognition rule 34. More specifically, the EWS 1 compresses the FBM 27a with 2×2 bits per pixel to generate the FBM 27f shown in FIG. 11C. The FBM 27f has a total of 256 pixels, specifically 16 pixels in the X direction×16 pixels in the Y direction. One pixel in the FBM 27f corresponds to 4 bits (2 bits in the X direction×2 bits in the Y direction) in the FBM 27a. Referring to the contents of the item 32b on the parallel recognition rule 34, if the FBM 27a contains one or more failure bits within 4 bits, the EWS 1 sets a pixel in the FBM 27f, which corresponds to those 4 bits, as a defective pixel. On the other hand, if no failure bits exist within 4 bits, a pixel corresponding to those 4 bits is set as a non-defective pixel. The FBM 27f contains four defective pixels 29f within the total of 256 pixels.

Thereafter, according to the flow charts shown in FIGS. 8 and 9, recognition in the failure mode "Bit-Fail" is made while repeating the updating of scan areas from U1 to U256. By that recognition, detailed failure information and failure data on the scan areas U137, U147, U151 and U190 are obtained and recorded after classification of failures as the failure mode "Bit-Fail".

After recognition in all the failure modes in the recognition rule has completed, i.e., if the result of the judgment in step SP214 is "No", the process goes to step SP216, thereby completing the failure recognition.

According to the failure analysis method of the second preferred embodiment, the FBM 27e having a pattern in which a plurality of strip pixels are arranged is generated by compressing the FBM 27a and a line failure can be determined based on the FBM 27e. Further, the FBM 27f having a pattern in which a plurality of pixels are arranged in a matrix is generated by compressing the FBM 27a and a bit failure can be determined based on the FBM 27f. In this way, using the FBMs 27e and 27f having different patterns allows failure recognition in individual failure modes.

Third Preferred Embodiment

FIGS. 12 to 15 are flow charts for explaining a failure analysis method according to a third preferred embodiment of the present invention. FIG. 16 is a diagram illustrating a recognition rule of the failure analysis method according to the third preferred embodiment. FIGS. 17A to 17D are diagrams respectively illustrating FBMs 27a, 27b, 27g and 27h in the failure analysis method according to the third preferred embodiment.

Hereinbelow, with reference to FIGS. 1, 12 to 16 and 17A to 17D, the failure analysis method according to the third preferred embodiment will be described with the focus on its differences from the failure analysis methods according to the aforementioned first and second preferred embodiments. In the following description, recognition prior to a transition to multi-level recognition is referred to as "ordinary recognition".

When failure recognition starts in step SP301, in step SP302, the EWS 1 reads a first parallel recognition rule for ordinary recognition from the database 4.

In step SP303, the EWS 1 compresses the original FBM 27a with 8×8 bits per pixel based on the contents of the first parallel recognition rule for the ordinary recognition, thereby to generate the FBM 27b shown in FIG. 17B. In step SP304, the EWS 1 sets a first failure mode "A-line-Fail" for the ordinary recognition. In step SP305, the EWS 1 sets the first scan area S1. In step SP306, the EWS 1 calculates a failure rate in the scan area S1. In the present example, the failure rate in the scan area S1 is calculated to be 100%. In step SP307, the EWS 1 judges whether the scan area S1 satisfies predetermined criteria of judgment. In the present example, the result of the judgment in step SP307 is "Yes". In step SP308, the EWS 1 judges whether the multi-level recognition rule is set or not. In the present example, the result of the judgment in step SP308 is "Yes".

Figure 15:
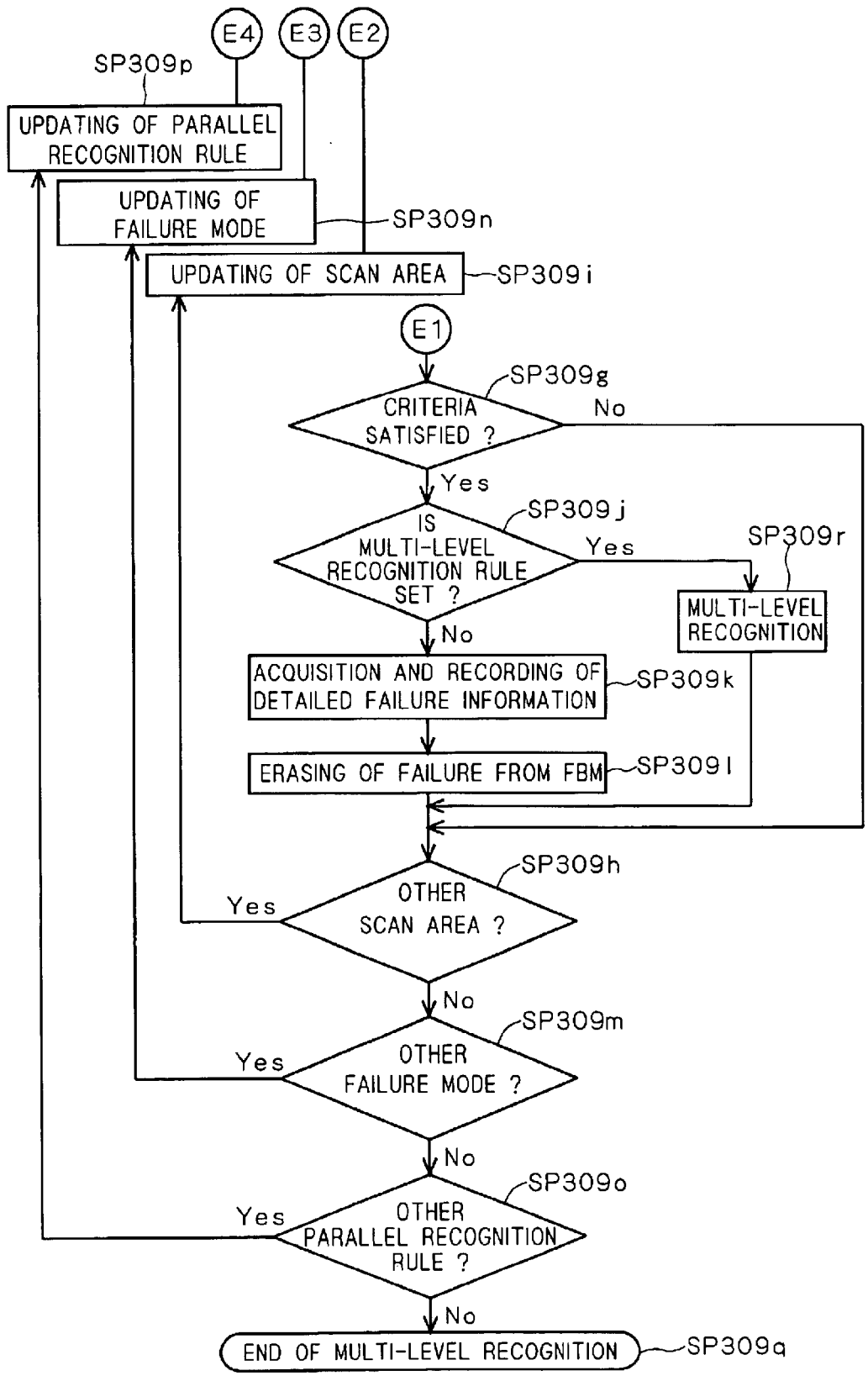
Figure 18:
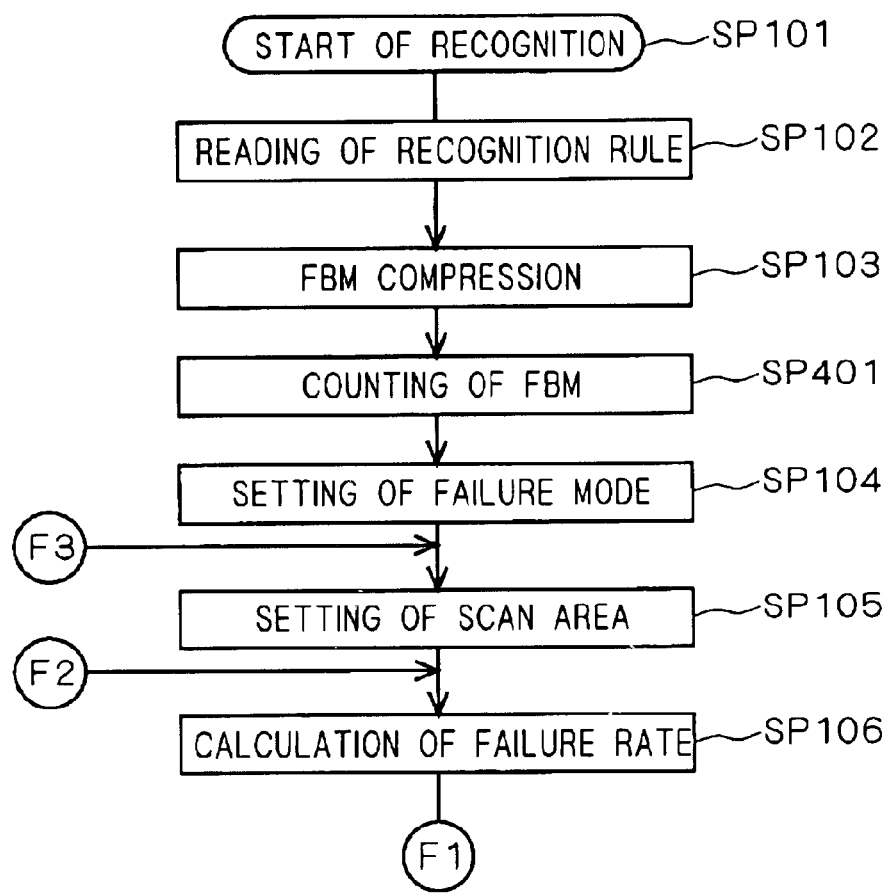
FIGS. 18 to 21 are flow charts for explaining a failure analysis method according to a fourth preferred embodiment of the present invention.

In step SP309, multi-level recognition is made. FIGS. 14 and 15 specifically illustrates a process flow of the multi-level recognition in step SP309. When the multi-level recognition process starts in step SP309a, in step SP309b, the EWS 1 reads a first parallel recognition rule 35 for the multi-level recognition. Then, in step SP309c, the EWS 1 compresses a portion of the FBM 27a which corresponds to the scan area S1 with 32×1 bits per pixel, thereby to generate the FBM 27g shown in FIG. 17C.

In step SP309d, the EWS 1 sets a failure mode "A-line-Fail". As in the aforementioned second preferred embodiment, recognition in the failure mode "A-line-Fail" is made on the scan areas S1 to S4. If the result of the judgment in step SP309m is "No", in step SP309o, the EWS 1 judges whether there remain any other parallel recognition rules. In the present example, a parallel recognition rule 36 remains; thus, the result of the judgment in step SP309o is "Yes". In step SP309p, the EWS 1 updates a parallel recognition rule, i.e., sets the second parallel recognition rule 36 for the multi-level recognition. Thereafter, as in the aforementioned second preferred embodiment, recognition based on the parallel recognition rule 36 is performed on the scan area S1. If the result of the judgment in step SP309o is "No", the process goes to step SP309q, thereby completing the multi-level recognition.

Figure 13:
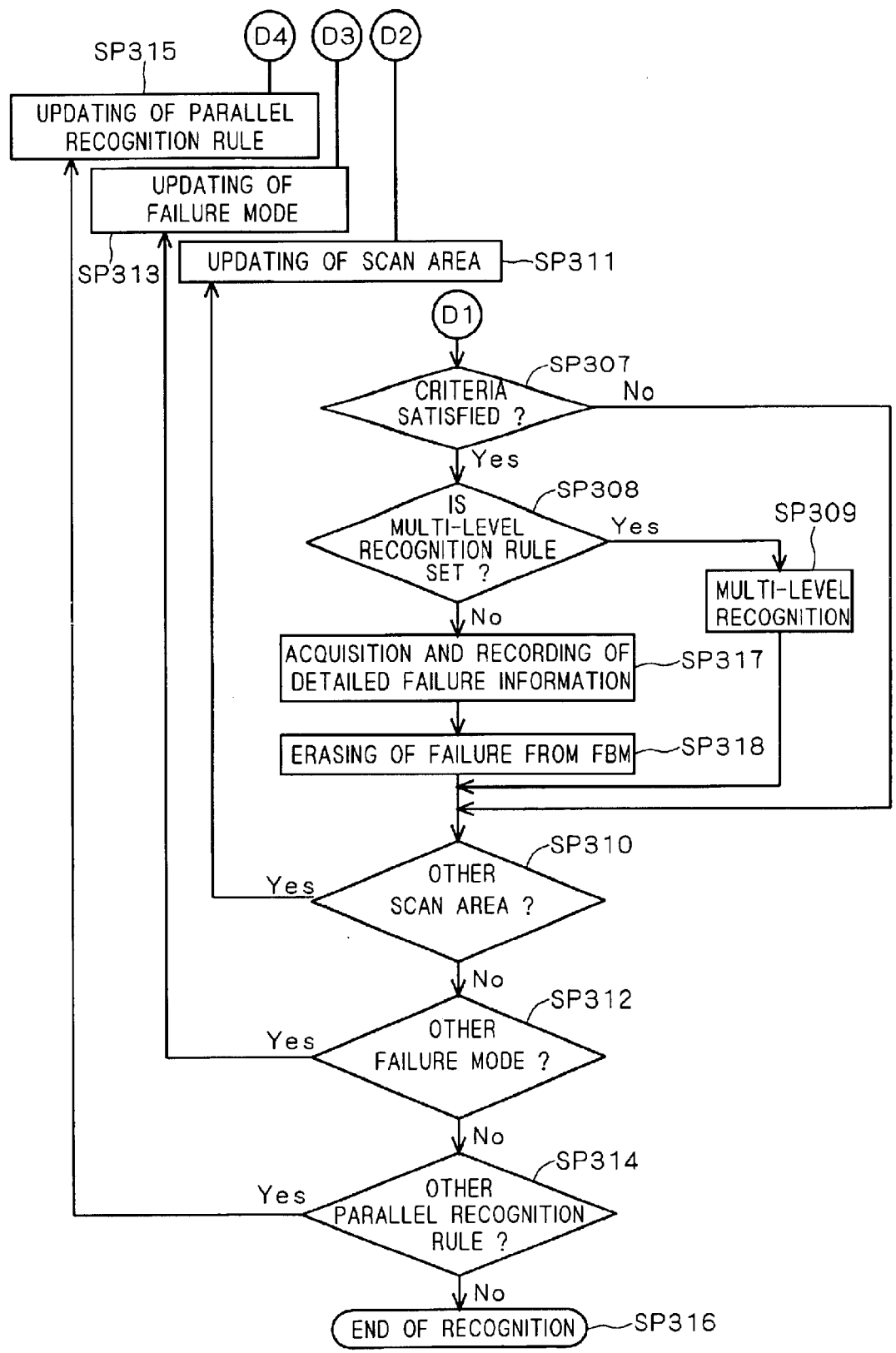

Referring to FIG. 13, after the judgment in step SP310, in step SP311, the EWS 1 updates a scan area to set the scan area S2 next to the scan area S1. Since the result of the judgment on the scan area S2 in step SP307 is "No", after the judgment in step SP310, the next scan area S3 is set in step SP311. The result of the judgment on the scan area S3 in step SP307 is "Yes"; thus, after the judgment in step SP308, the process goes to the multi-level recognition in step SP309.

Referring to FIGS. 14 and 15, in the manner as above described, recognition based on the first parallel recognition rule 35 for the multi-level recognition is carried out. The EWS 1 then updates a parallel recognition rule in step SP309p, i.e., sets the second parallel recognition rule 36 for the multi-level recognition. In step SP309c, the EWS 1 compresses a portion of the FBM 27a which corresponds to the scan area S3 with 2×2 bits per pixel, thereby to generate the FBM 27h shown in FIG. 17D. Then, in step SP309d, the EWS 1 sets the failure mode "Bit-Fail". As in the aforementioned second preferred embodiment, recognition in the failure mode "Bit-Fail" is performed on the scan areas T1 to T64. Thereafter, if the result of the judgment in step SP309o is "No", the process goes to step SP309q, thereby completing the multi-level recognition process.

Referring to FIG. 13, after the judgment in step SP310, in step SP311, the EWS 1 updates a scan area, i.e., sets the scan area S4 next to the scan area S3. Since the result of the judgment on the scan area S4 in step SP307 is "No", after the judgment in step SP310, the EWS 1 judges whether there remain any other failure modes in step SP312. In step SP313, the EWS 1 sets a second failure mode "B-line-Fail" for the ordinary recognition. Thereafter, although not described, recognition in the failure mode "B-line-Fail" is carried out.

If the result of the judgment in step SP312 is "No", in step SP314, the EWS 1 judges whether there remain any other parallel recognition rules. If there remain any other parallel recognition rules, a second parallel recognition rule for the ordinary recognition is set in step SP315 and recognition based on that parallel recognition rule is carried out. If no parallel recognition rule remains, the process goes to step SP316, thereby completing the failure recognition.

According to the failure analysis method of the third preferred embodiment, failure recognition can be performed for individual failure modes as in the failure analysis method according to the aforementioned second preferred embodiment. Besides, after determination of a failure area based on the FBM 27b, the FBMs 27g and 27h are generated only for a portion corresponding to the failure area. This minimizes an increase in the amount of data to be processed.

Fourth Preferred Embodiment

FIGS. 18 to 21 are flow charts for explaining a failure analysis method according to a fourth preferred embodiment of the present invention. Hereinbelow, with reference to FIGS. 1, 7A to 7D and 18 to 21, the failure analysis method according to the fourth preferred embodiment will be described with the focus on its differences from the failure analysis method according to the aforementioned first preferred embodiment.

First, as in the aforementioned first preferred embodiment, the EWS 1 performs the processing of steps SP101 to SP103. In step SP401, the EWS 1 counts a total number of failure bits (FBC) existing within the FBM 27a. In the present example, FBC=68. The counting of the FBC may be performed simultaneously with the generation of the FBM 27a. The EWS 1 then, as in the aforementioned first preferred embodiment, performs the processing of steps SP104 to SP108.

In step SP109, multi-level recognition of the scan area S1 is carried out. First, referring to FIGS. 20 and 21, as in the aforementioned first preferred embodiment, the EWS 1 performs the processing of steps SP109a and SP109b to generate the FBM 27c. In step SP402, the EWS 1 counts a total number of failure bits (FBCn) existing within a portion of the FBM 27a which corresponds to the scan area S1. Where n is a natural number and corresponds to the number of times that the multi-level recognition has been carried out. For example, n=1 in the first multi-level recognition and n=2 in the second multi-level recognition. In the present example, FBCn=FBC1=64. Then, as in the aforementioned first preferred embodiment, the EWS 1 performs the processing of steps SP109c to SP109j.

In step SP403, the EWS 1 erases the defective pixels 28c from the FBM 27c and subtracts a total number of failure bits 28a corresponding to the erased defective pixels 28c from both the FBC and the FBCn. In the present example, after the subtraction in step SP403, FBC becomes 4 and FBCn becomes 0.

In step SP404, the EWS 1 judges whether FBCn=0. In the present example, FBCn=0; thus, the result of the judgment in step SP404 is "Yes". Accordingly, the process goes to step SP109n, thereby completing the multi-level recognition process for the scan area S1.

Figure 19:
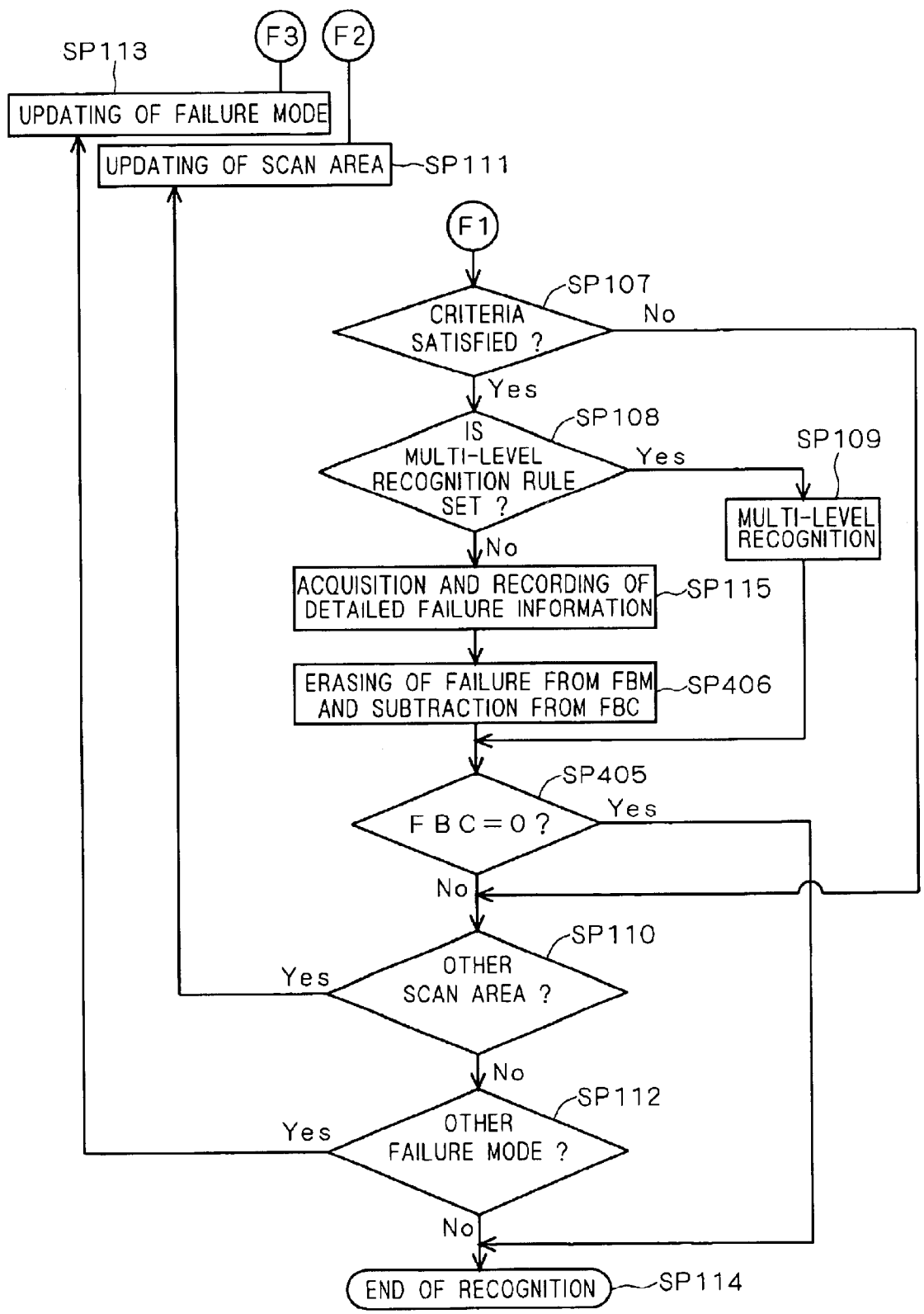
Figure 20:
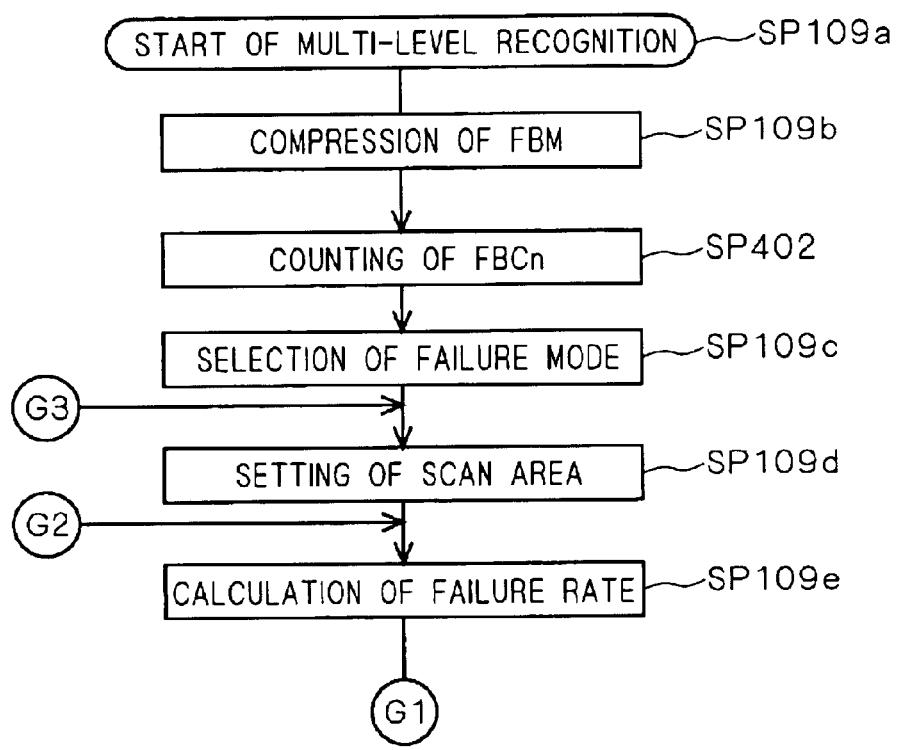
Figure 21:
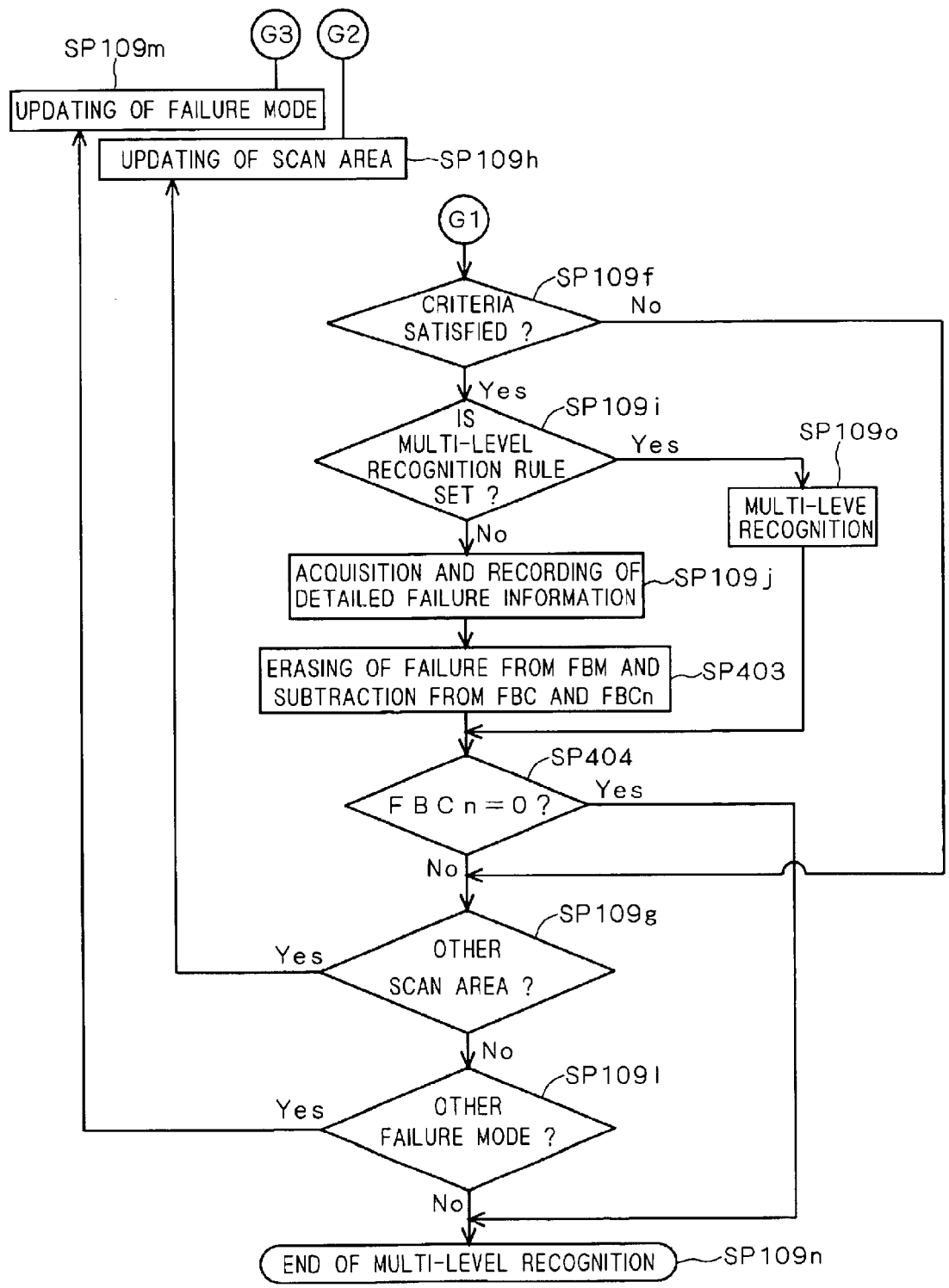

Referring to FIG. 19, in step SP405, the EWS 1 judges whether FBC=0. In the present example, FBC=4; thus, the result of the judgment in step SP405 is "No". Then, as in the aforementioned first preferred embodiment, after the setting of the scan area S2, the scan area S3 is set. In step SP109, the multi-level recognition is performed on the scan area S3. In step SP402, the EWS 1 counts the FBCn in a portion of the FBM 27a which corresponds to the scan area S3. In the present example, FBCn=4. Then, as in the aforementioned first preferred embodiment, after multi-level recognition in the first failure mode "A-Line-Fail", the EWS 1 generates the FBM 27d and starts the recognition in the second failure mode "Bit-Fail".

Starting from the scan area U1, recognition in the failure mode "Bit-Fail" is performed while updating scan areas. Every time detailed failure information is obtained in step SP109j, the erasing of a defective pixel 29c from the FBM 27d and the subtraction from the FBC and the FBCn are performed. In the present example, FBCn becomes 0 at a time when the defective pixel 29c corresponding to the scan area U46 is erased. As a consequence, the answer to the judgment in step SP404 is "Yes" and the process goes to step SP109n, thereby completing the multi-level recognition of the scan area S3.

Then, referring to FIG. 19, the EWS 1 judges whether FBC=0 in step SP405. In the present example, FBC=0; thus, the result of the judgment in step SP405 is "Yes". Accordingly, the process goes to step SP114, thereby completing the failure recognition.

According to the failure analysis method of the fourth preferred embodiment, the total number of failure bits existing within the FBM 27a is previously obtained and, during the process of failure recognition with the scanning of the FBMs 27c and 27d, failure recognition is terminated at a time when a cumulative total of failure bits determined step by step reaches the previously obtained total number. This avoids the necessity of performing an unnecessary scan after all failure bits are determined, thereby shortening the time required for recognition as compared with the failure analysis method according to the aforementioned first preferred embodiment.

Fifth Preferred Embodiment

Figure 22:
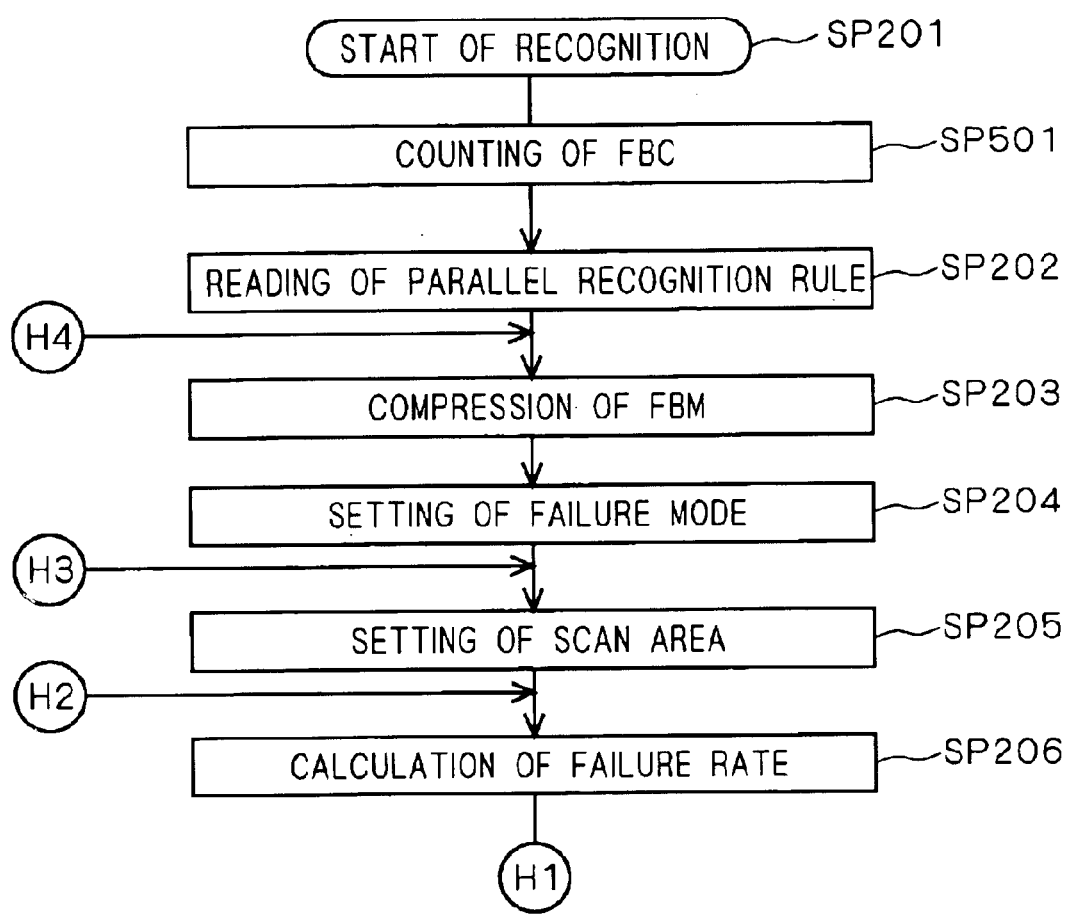
FIGS. 22 and 23 are flow charts for explaining a failure analysis method according to a fifth preferred embodiment of the present invention.
Figure 23:
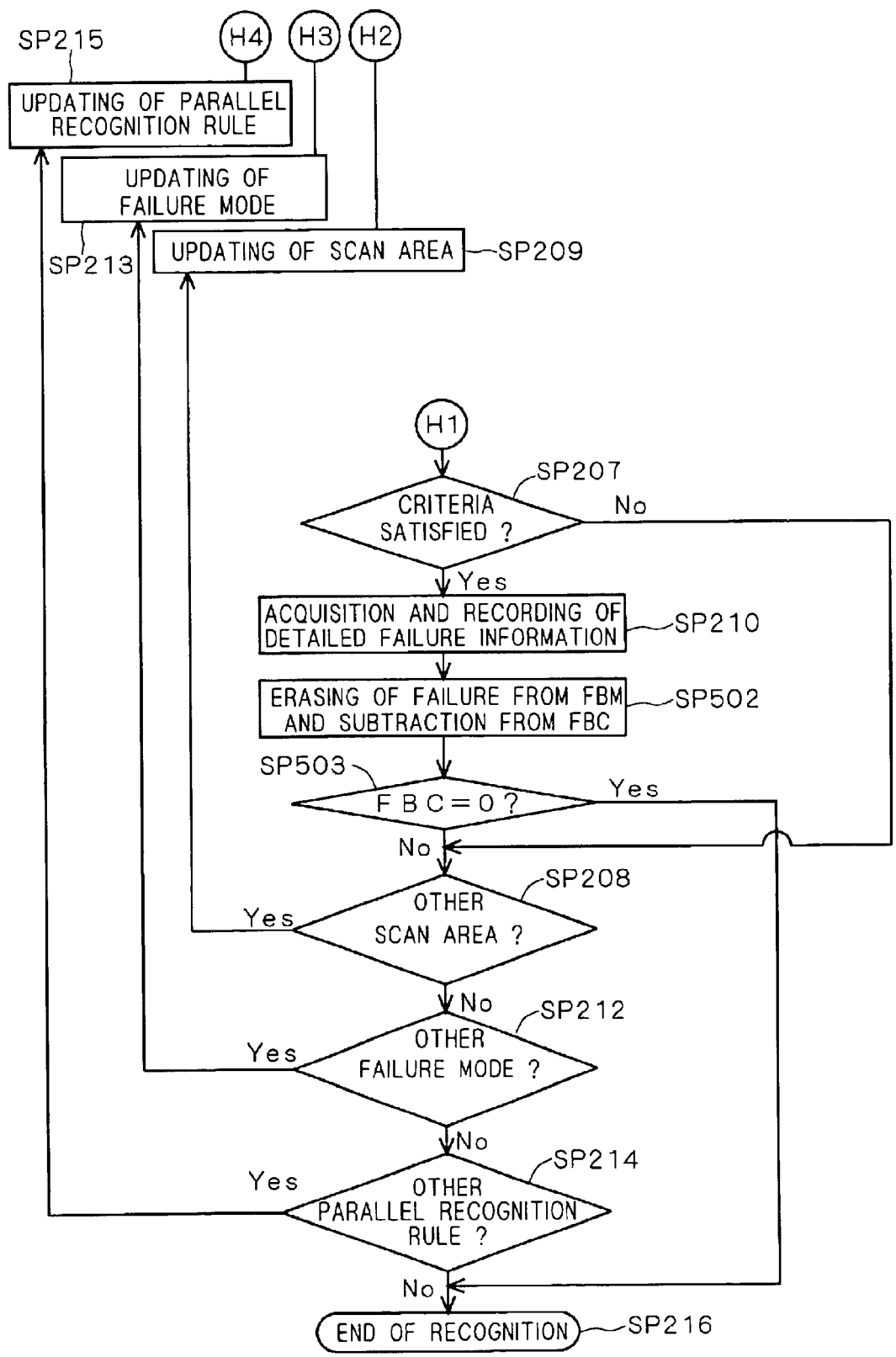
Figure 24:
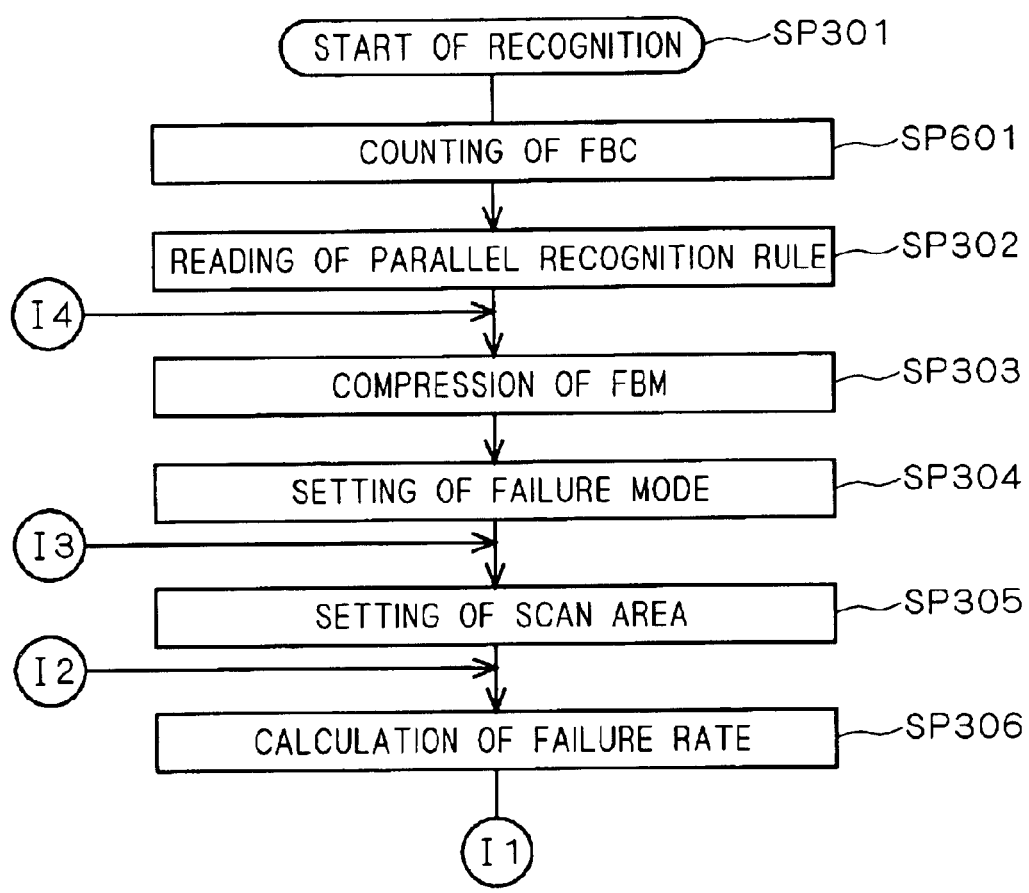
FIGS. 24 to 27 are flow charts for explaining a failure analysis method according to a sixth preferred embodiment of the present invention.

FIGS. 22 and 23 are flow charts for explaining a failure analysis method according to a fifth preferred embodiment of the present invention. Hereinbelow, with reference to FIGS. 1, 10, 11A to 11C, 22 and 23, the failure analysis method according to the fifth preferred embodiment will be described with the focus on its differences from the failure analysis method according to the aforementioned second preferred embodiment.

When failure recognition starts in step SP201, in step SP501, the EWS 1 counts the total number of failure bits (FBC) existing within the FBM 27a. In the present example, FBC=68. Then, as in the aforementioned second preferred embodiment, the EWS 1 generates the FBM 27e and performs the processing of steps SP202 to SP210 based on the first parallel recognition rule 33.

In step SP502, the EWS 1 erases the defective pixels 28e from the FBM 27e and subtracts a total number of failure bits 28a corresponding to the erased defective pixels 28e from the FBC. In the present example, after the subtraction in step SP502, FBC becomes 4.

In step SP503, the EWS 1 judges whether FBC=0. In the present example, FBC=4; thus, the result of the judgment in step SP503 is "No". After that, as in the aforementioned second preferred embodiment, the FBM 27f is generated and failure recognition based on the second parallel recognition rule 34 is carried out.

Starting from the scan area U1, recognition based on the parallel recognition rule 34 is carried out while updating scan areas. Every time detailed failure information is obtained in step SP210, the erasing of a defective pixel 29f from the FBM 27f and the subtraction from the FBC are performed in step SP502. In the present example, FBC becomes 0 at a time when the defective pixel 29f corresponding to the scan area U190 is erased. As a consequence, the answer to the judgment in step SP503 is "Yes" and the process goes to step SP216, thereby completing the failure recognition.

According to the failure analysis method of the fifth preferred embodiment, the total number of failure bits existing within the FBM 27a is previously obtained and, during the process of failure recognition with the scanning of the FBMs 27e and 27f, failure recognition is terminated at a time when a cumulative total of failure bits determined step by step reaches the previously obtained total number. This avoids the necessity of performing an unnecessary scan after all failure bits are determined, thereby shortening the time required for recognition as compared with the failure analysis method according to the aforementioned second preferred embodiment.

Sixth Preferred Embodiment

FIGS. 24 to 27 are flow charts for explaining a failure analysis method according to a sixth preferred embodiment of the present invention. Hereinbelow, with reference to FIGS. 1, 16, 17A to 17D and 24 to 27, the failure analysis method according to the sixth preferred embodiment will be described with the focus on its differences from the failure analysis method according to the aforementioned third preferred embodiment.

When failure recognition starts in step SP301, in step SP601, the EWS 1 counts the total number of failure bits (FBC) existing within the FBM 27a. In the present example, FBC=68. Then, as in the aforementioned third preferred embodiment, the EWS 1 performs the processing of steps SP302 to SP308.

Figure 26:
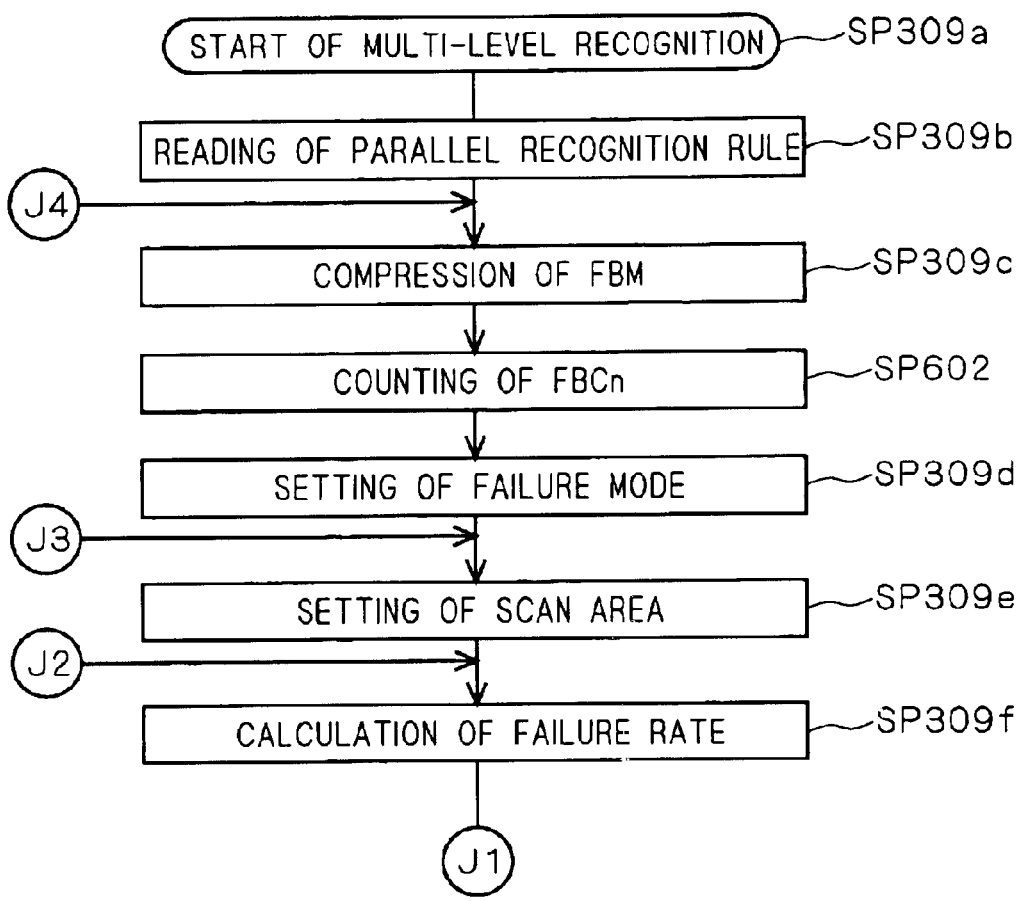
Figure 27:
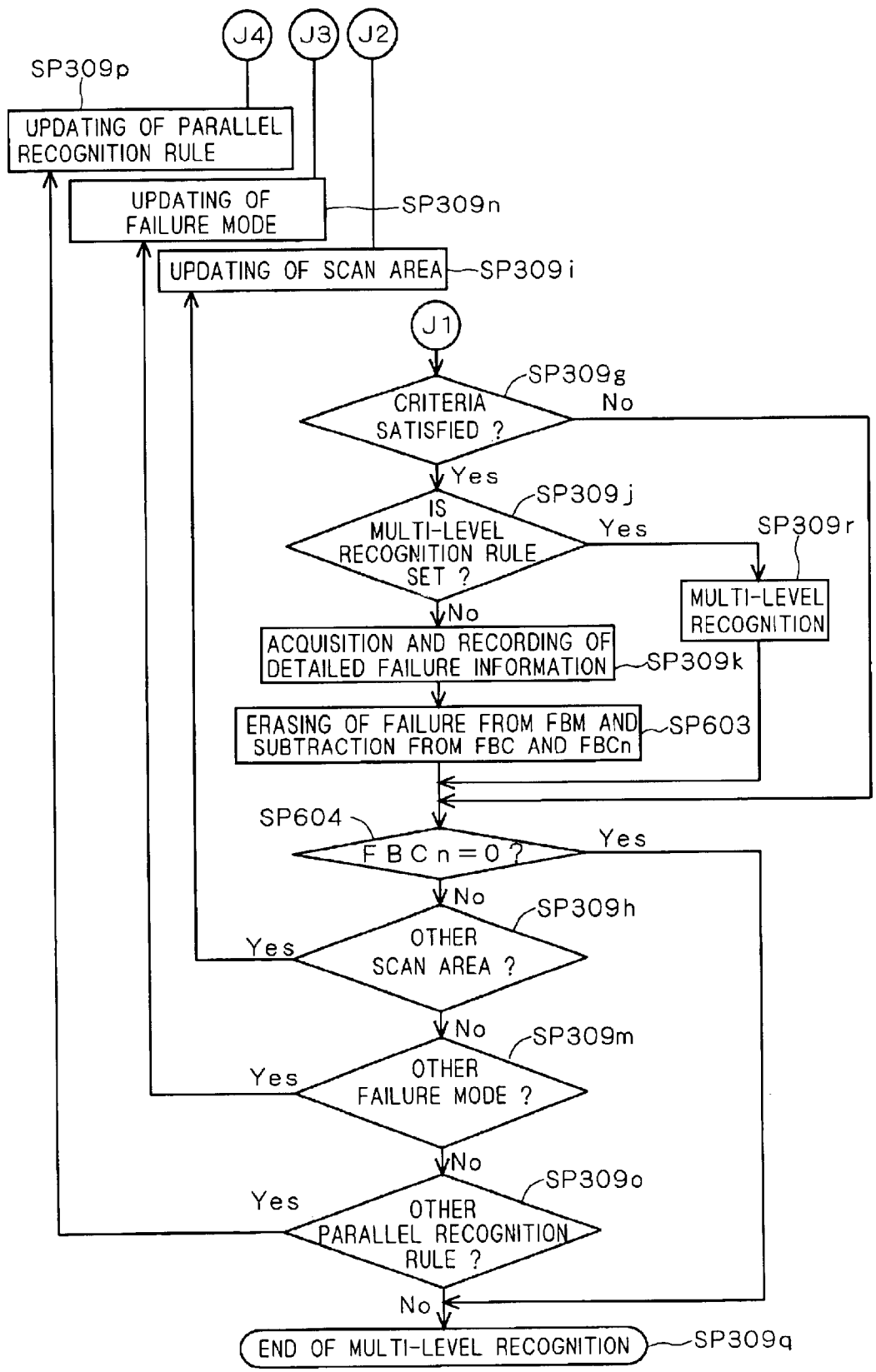

In step SP309, multi-level recognition of the scan area S1 is carried out. Referring to FIGS. 26 and 27, as in the aforementioned third preferred embodiment, the EWS 1 performs the processing of steps SP309a to SP309c to generate the FBM 27g.

In step SP602, the EWS 1 counts the total number of failure bits (FBCn) existing within a portion of the FBM 27a which corresponds to the scan area S1. In the present example, FBCn=64. Then, as in the aforementioned third preferred embodiment, the EWS 1 performs the processing of steps SP309d to SP309k.

In step SP603, the EWS 1 erases the defective pixels 28g from the FBM 27g and subtracts a total number of failure bits 28a corresponding to the erased defective pixels 28g from both the FBC and the FBCn. In the present example, after the subtraction in step SP603, FBC becomes 4 and FBCn becomes 0.

In step SP604, the EWS 1 judges whether FBCn=0. In the present example, FBCn=0; thus, the result of the judgment in step SP604 is "Yes". Accordingly, the process goes to step SP309q, thereby completing the process for multi-level recognition of the scan area S1.

Figure 25:
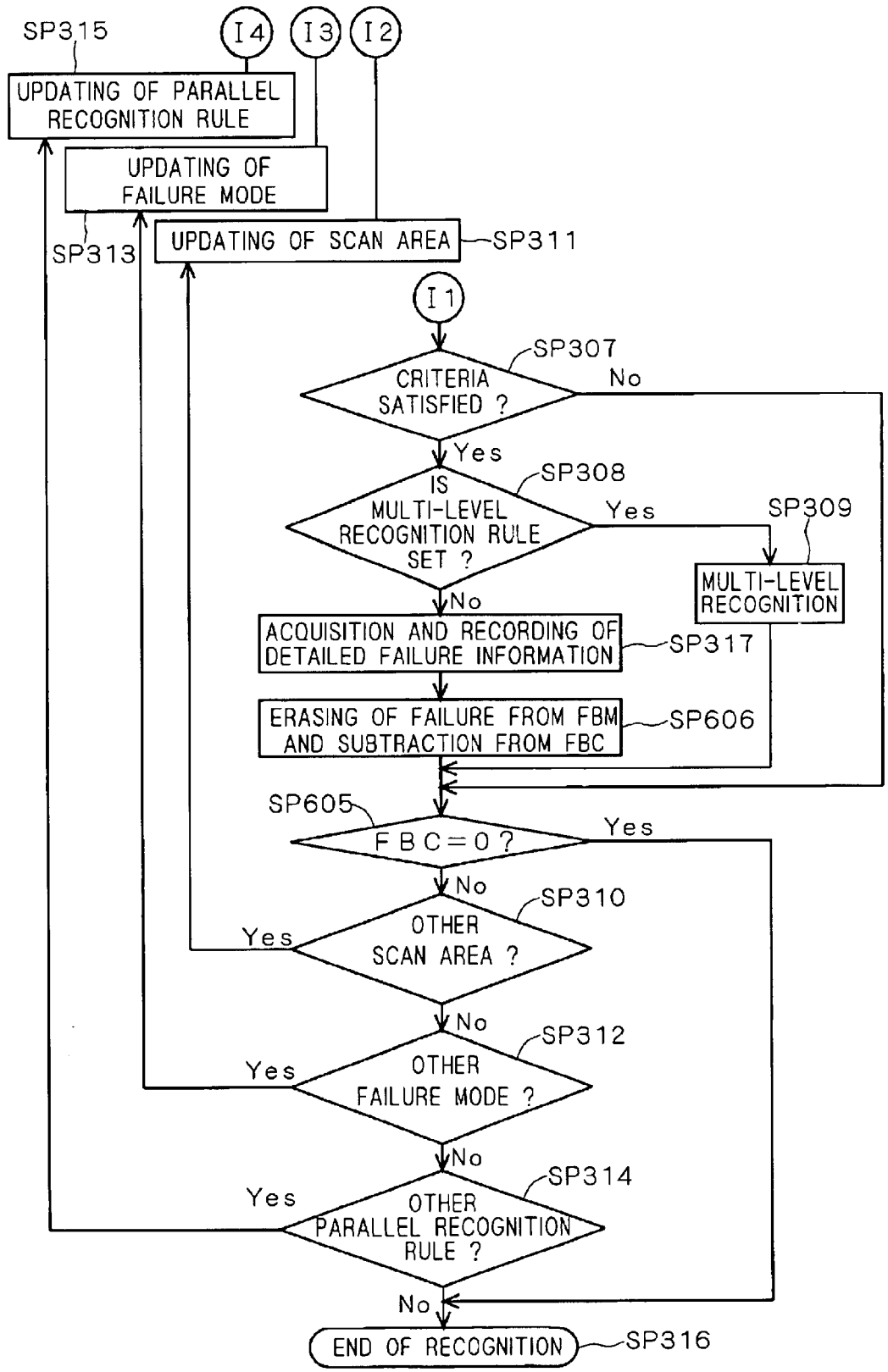

Then, referring to FIG. 25, the EWS 1 judges whether FBC=0 in step SP605. In the present example, FBC=4; thus, the result of the judgment in step SP605 is "No". Then, as in the aforementioned third preferred embodiment, after the setting of the scan area S2, the scan area S3 is set. In step SP309, multi-level recognition of the scan area S3 is carried out. In step SP602, the EWS 1 counts the FBCn in a portion of the FBM 27a which corresponds to the scan area S3. In the present example, FBCn=4. Then, as in the aforementioned third preferred embodiment, the EWS 1 generates the FBM 27h after recognition based on the first parallel recognition rule 35 and starts recognition based on the second parallel recognition rule 36.

Starting from the scan area Ti, recognition based on the parallel recognition rule 36 is carried out while updating scan areas. Every time detailed failure information is obtained in step SP309k, the erasing of a defective pixel 29h from the FBM 27h and the subtraction from the FBC and the FBCn are performed in step SP603. In the present example, FBCn becomes 0 at a time when the defective pixel 29h corresponding to the scan area T62 is erased. As a consequence, the answer to the judgment in step SP604 is "Yes" and the process goes to step SP309q, thereby completing the multi-level recognition of the scan area S3.

Referring to FIG. 25, the EWS 1 judges whether FBC=0 in step SP605. In the present example, FBC=0; thus, the result of the judgment in step SP605 is "Yes". Accordingly, the process goes to step SP316, thereby completing the failure recognition.

According to the failure analysis method of the sixth preferred embodiment, the total number of failure bits existing within the FBM 27a is previously obtained and, during the process of failure recognition with the scanning of the FBMs 27g and 27h, failure recognition is terminated at a time when a cumulative total of failure bits determined step by step reaches the previously obtained total number. This avoids the necessity of performing an unnecessary scan after all failure bits are determined, thereby shortening the time required for recognition as compared with the failure analysis method according to the aforementioned third preferred embodiment.

Seventh Preferred Embodiment

Figure 29A:
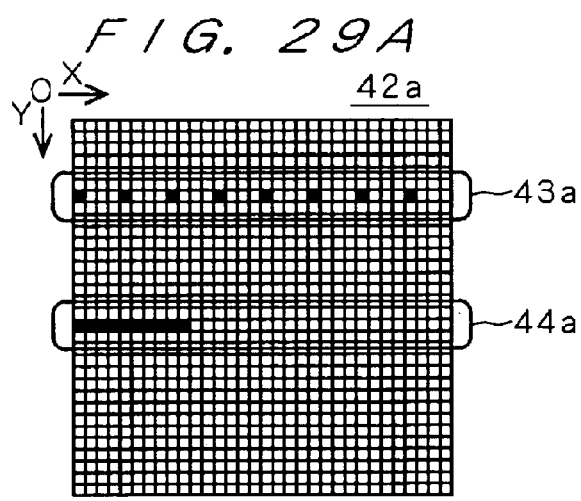
FIGS. 29A to 29C are diagrams illustrating FBMs in the failure analysis method according to the seventh preferred embodiment of the present invention.
Figure 29B:
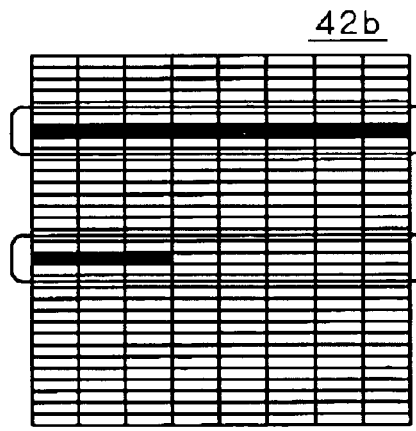
Figure 29C:
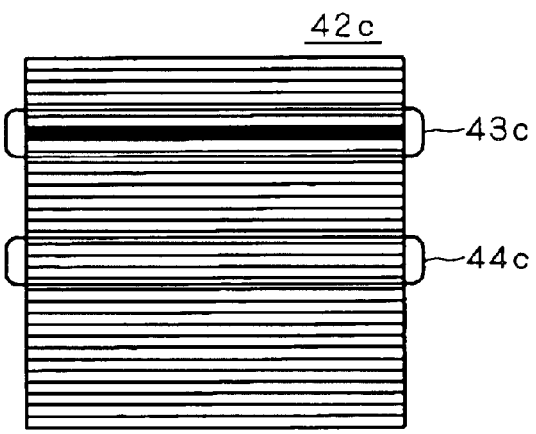

FIG. 28 is a diagram illustrating a recognition rule of a failure analysis method according to a seventh preferred embodiment of the present invention. FIGS. 29A to 29C are diagrams respectively illustrating FBMs 42a to 42c in the failure analysis method according to the seventh preferred embodiment.

The failure analysis method according to the seventh preferred embodiment relates to improvements in the process of generating the FBM 27e by compressing the FBM 27a in the aforementioned second preferred embodiment and in the process of generating the FBM 27g by compressing the FBM 27a in the aforementioned third preferred embodiment.

Referring to FIG. 29A, the original FBM 42a contains 8 failure bits 43a and 10 failure bits 44a. The failure bits 43a form a line failure having a characteristic that a failure occurs every four bits. The failure bits 44a are bit failures arranged in a straight line.

In the failure analysis method according to the seventh preferred embodiment, the EWS 1 compresses the 32- by 32-bit FBM 42a with 4×1 bits per pixel, based on the contents of the item 18 on the recognition rule shown in FIG. 28, thereby to generate the FBM 42b shown in FIG. 29B. One pixel in the FBM 42b corresponds to 4 bits (4×1 bits) in the FBM 42a. The FBM 42b contains 8 pixels in a single line. Referring to the contents of the item 32 on the recognition rule shown in FIG. 28, if the FBM 42a contains even a single failure bit within 4 bits, the EWS 1 sets a pixel in the FBM 42b, which corresponds to those 4 bits, as a defective pixel. On the other hand, if no single failure bit exists within 4 bits, a pixel corresponding to those 4 bits is defined as a non-defective pixel. The FBM 42b contains 8 defective pixels 43b corresponding to the failure bits 43a and 3 defective pixels 44b corresponding to the failure bits 44a.

Then, the EWS 1 compresses the FBM 42b with 8×1 pixels per pixel, based on the contents of an item 40 on the recognition rule shown in FIG. 28, thereby to generate the FBM 42c shown in FIG. 29C. One pixel in the FBM 42c corresponds to a single line (8 pixels) of the FBM 42b. Referring to the contents of an item 41 on the recognition rule shown in FIG. 28, if the FBM 42b contains 4 or more defective pixels in a single line, the EWS 1 sets a pixel in the FBM 42c, which corresponds to that line, as a defective pixel. On the other hand, if the number of defective pixels within a single line is less than 4, a pixel corresponding to that line is set as a non-defective pixel. The FBM 42c contains a defective pixel 43c corresponding to the defective pixels 43b. On the other hand, since there are only three defective pixels 44b in the FBM 42b, the FBM 42c contains no defective pixel 44c corresponding to the defective pixels 44b.

As above described, according to the failure analysis method of the seventh preferred embodiment, the FBM 42c is generated by compressing the FBM 42a in two steps. Thus, even if the FBM 42a contains the failure bits 43a which are successively spaced from each other, forming a line failure, the defective pixel 43c corresponding to the failure bits 43a can be set with high precision in the FBM 42c.

While the compression threshold value, i.e., the item 32a on the recognition rule shown in FIG. 10 is set to 16 bits, it is also possible, by reducing the threshold value to 8 bits, to set the defective pixel 43c corresponding to the failure bits 43a in the FBM 42c. In this case, however, a defective pixel 44c corresponding to the failure bits 44a will be set by mistake in the FBM 42c. In the failure analysis method according to the seventh preferred embodiment, on the other hand, as above described, no defective pixel 44c corresponding to the failure bits 44a is set.

Eighth Preferred Embodiment

Figure 31A:
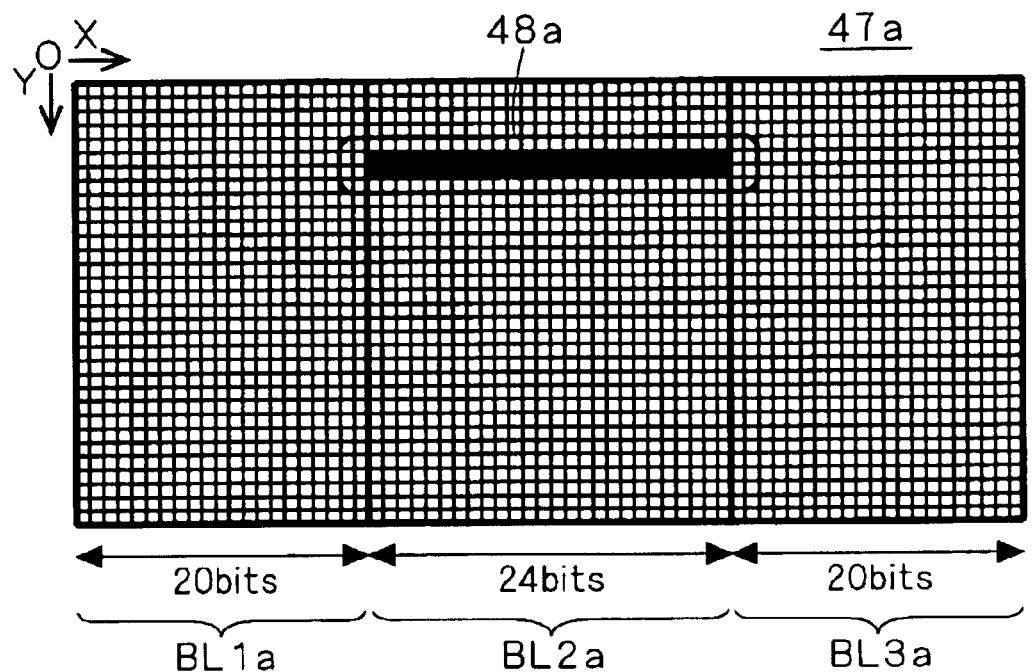
FIGS. 31A and 31B are diagrams illustrating FBMs in the failure analysis method according to the eighth preferred embodiment of the present invention.
Figure 31B:
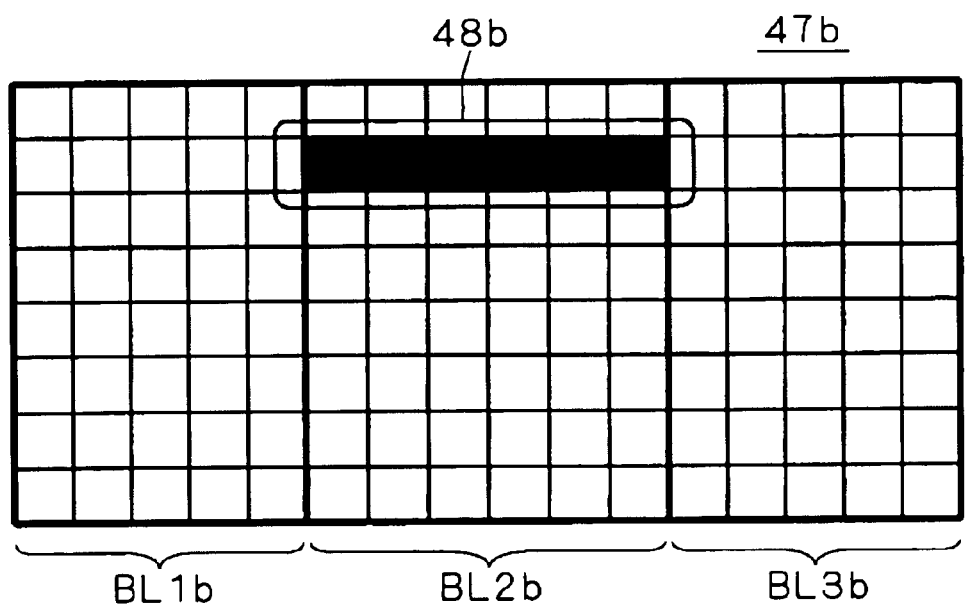

FIG. 30 is a diagram illustrating a recognition rule of a failure analysis method according to an eighth preferred embodiment of the present invention. FIGS. 31A and 31B are diagrams respectively illustrating FBMs 47a and 47b in the failure analysis method according to the eighth preferred embodiment.

The failure analysis method according to the eighth preferred embodiment relates to a modification to the process of generating the FBM 27b by compressing the FBM 27a in the aforementioned first and third preferred embodiments.

A memory cell array in a memory LSI to be tested in the eighth preferred embodiment is divided into three blocks respectively having block sizes of 20×32 bits, 24×32 bits and 20×32 bits. Referring to FIG. 31A, the original FBM 47a has a pattern in which 2048 (64×32) bits are arranged in a matrix. The FBM 47a is divided into three blocks BL1a, BL2a and BL3a in correspondence with the pattern of a memory cell array. In FIG. 31A, the boundaries between adjacent blocks are indicated by thick solid lines. The block sizes of the blocks BL1a to BL3a are 20×32 bits, 24×32 bits and 20×32 bits, respectively. Further, the FBM 47a contains 48 failure bits 48a forming a line failure.

In the failure analysis method according to the eighth preferred embodiment, the EWS 1 compresses the FBM 47a with 4×4 bits per pixel, based on the contents of the item 18 on the recognition rule shown in FIG. 30, thereby to generate the FBM 47b shown in FIG. 31B. One pixel in the FBM 47b corresponds to 16 bits (4×4 bits) in the FBM 47a. Like the FBM 47a, the FBM 47b is also divided into three blocks BL1b, BL2b and BL3b in correspondence with the pattern of the memory cell array. In FIG. 31B, the boundaries between adjacent blocks are indicated by thick solid lines. The block size of the blocks BL1b and BL3b is 5×8 pixels and that of the block BL2b is 6×8 pixels. Referring to the contents of the item 32 on the recognition rule shown in FIG. 30, the EWS 1 sets defective and non-defective pixels in the FBM 47b. The FBM 47b contains six defective pixels 48b corresponding to the failure bits 48a.

Referring to FIG. 30, an item 45 regarding the failure size and an item 46 regarding the scan size describe the block sizes of the blocks BL1b to BL3b with respect to the X direction, each block size separated by a comma. In steps SP105 and SP305, based on the contents of the item 45, the EWS 1 sets 5×1 pixels in the first line of the block BL1b as a first scan area, 6×1 pixels in the first line of the block BL2b as a second scan area, and 5×1 pixels in the first line of the block BL3b as a third scan area. In steps SP111 and SP311, based on the contents of the item 46, the EWS 1 sets 5×1 pixels in the second line of the block BL1b as a fourth scan area, 6×1 pixels in the second line of the block BL2b as a fifth scan area, and 5×1 pixels in the second line of the block BL3b as a sixth scan area. Hereinafter, in similar fashion, a scan area is updated.

According to the failure analysis method of the eighth preferred embodiment, even if an object to be tested is a memory LSI which has a memory cell array divided into a plurality of blocks of different block sizes, proper failure analysis can be performed for each of the blocks BL1b to BL3b by listing the block sizes of the blocks BL1b to BL3b of the FBM 47b with respect to the X direction in the recognition rule.

Ninth Preferred Embodiment

FIG. 32 is a diagram illustrating a recognition rule of a failure analysis method according to a ninth preferred embodiment of the present invention. In the above eighth preferred embodiment, as shown in FIG. 30, the block sizes of the blocks BL1b to BL3b with respect to the X direction are listed in the lower items 45 and 46 on the recognition rule. On the other hand, in the failure analysis method according to the ninth preferred embodiment, an item 49 regarding "X-Block" is provided at the beginning of the recognition rule as shown in FIG. 32. The item 49 describes the block sizes of the blocks BL1a to BL3a with respect to the X direction, each block size separated by a comma. If a plurality of blocks have different block sizes with respect to the Y direction, an item regarding "Y-Block" should be provided. If there are a plurality of kinds of blocks, an item regarding "X- or Y-Blockn" (where n=1, 2, 3, . . . ) should be provided.

The EWS 1 divides the individual values "20, 24, 20" of the item 49 by "4", the compression ratio with respect to the X direction and sets or updates a scan area using the values "5, 6, 5" obtained by the division. This achieves similar operations to those described in the aforementioned eighth preferred embodiment in setting or updating a scan area.

According to the failure analysis method of the ninth preferred embodiment, the block sizes of the blocks BL1a to BL3*a* are described at the beginning of the recognition rule, instead of listing the block sizes of the blocks BL1*b* to BL3*b* in the items 45 and 46 on the recognition rule. This, as compared to the aforementioned eighth preferred embodiment, simplifies the contents of description of the recognition rule.

Tenth Preferred Embodiment

Figure 34A:
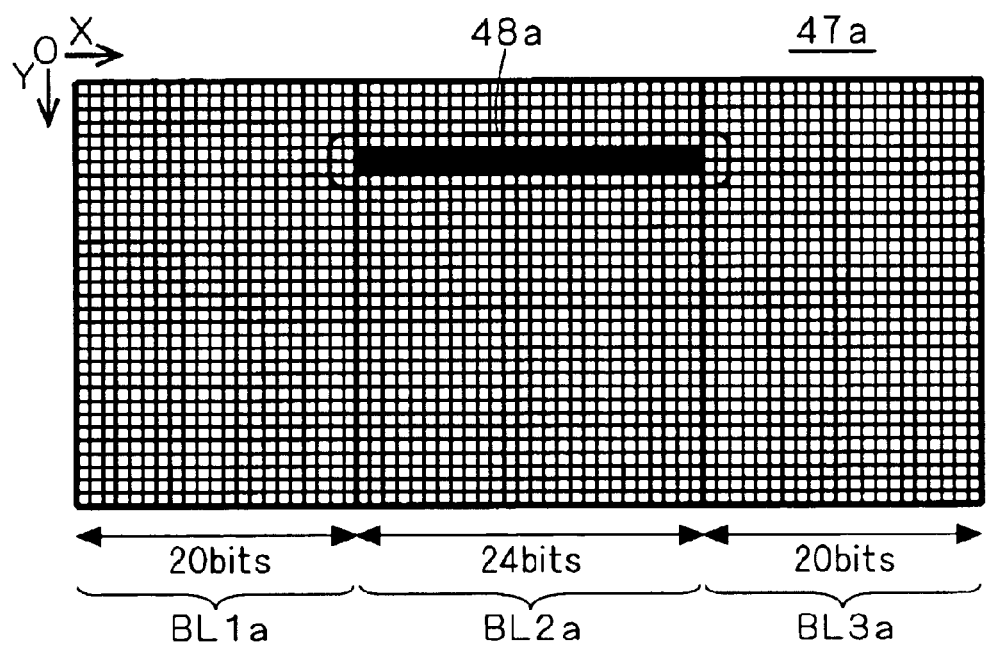
FIGS. 34A and 34B are diagrams illustrating FBMs in the failure analysis method according to the tenth preferred embodiment of the present invention.
Figure 34B:
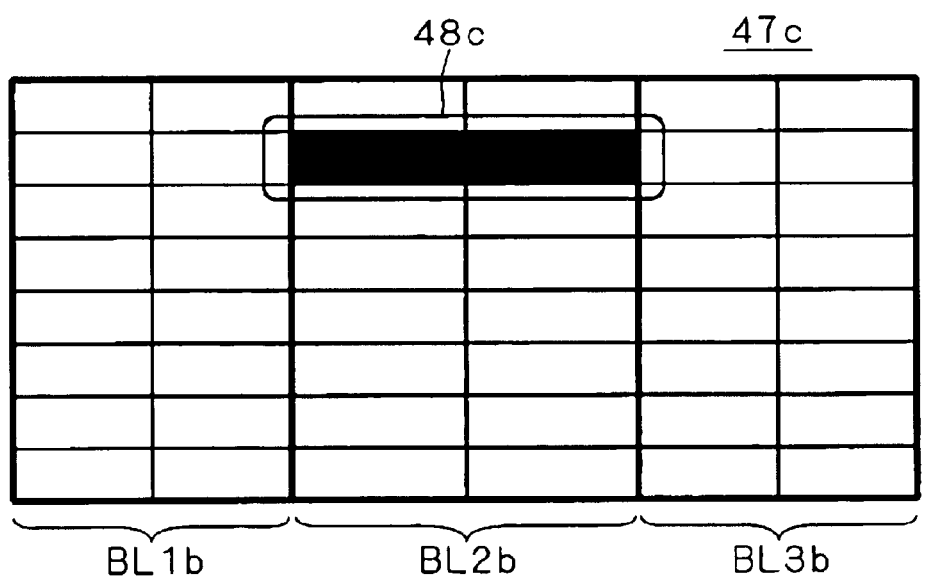

FIG. 33 is a diagram illustrating a recognition rule of a failure analysis method according to a tenth preferred embodiment of the present invention. FIGS. 34A and 34B are diagrams respectively illustrating FBMs 47*a* and 47*c* in the failure analysis method according to the tenth preferred embodiment.

Referring to FIG. 33, an item 50 describes a compression ratio in compressing the FBM 47*a*, the compression ratio with respect to the X direction including a plurality of values separated by a comma. Those plurality of values indicate how to divide the number of bits with respect to the X direction in the FBM 47*a* during compression. In the present example, the item 50 describes that a single line (64 bits) of the FBM 47*a* is divided into 10, 10, 12, 12, 10 and 10 bits.

In steps SP103 and SP303, the EWS 1 compresses the FBM 47*a* based on the contents of the item 50, thereby to generate the FBM 47*c* shown in FIG. 34B. The block size of the blocks BL1*b* to BL3*b* is 2×8 pixels. One pixel in the blocks BL1*b* and BL3*b* corresponds to 10×4 bits in the FBM 47*a*, and one pixel in the block BL2*b* corresponds to 12×4 bits in the FBM 47*a*.

As above described, according to the failure analysis method of the tenth preferred embodiment, even if an object to be tested is a memory LSI which has a memory cell array divided into a plurality of blocks of different block sizes, proper failure analysis can be performed by changing the compression ratio for each block.

In the aforementioned eighth and ninth preferred embodiments, in order to equalize the size of each pixel among the respective blocks BL1*b* to BL3*b* of the FBM 47*b*, it is necessary to set the compression ratio with respect to the X direction to a common measure of the numbers of bits with respect to the X direction in the respective blocks BL1*a* to BL3*a*. In the failure analysis method according to the tenth preferred embodiment, on the other hand, there is no such limitations and the compression ratio with respect to the X direction can be set larger than in the aforementioned eighth and ninth preferred embodiments. This reduces the amount of data to be processed.

Eleventh Preferred Embodiment

FIG. 35 is a diagram illustrating a recognition rule of a failure analysis method according to an eleventh preferred embodiment of the present invention. In the above tenth preferred embodiment, as shown in FIG. 33, the item 50 on the recognition rule describes a plurality of values directly indicating how to divide the number of bits in a single line of the FBM 47*a*. In the failure analysis method according to the eleventh preferred embodiment, on the other hand, as in the aforementioned ninth preferred embodiment, the item 49 regarding "X-block" is provided at the beginning of the recognition rule.

The EWS 1 divides the individual values "20, 24, 20" of the item 49 by "2", the number of pixels with respect to the X direction in each of the blocks BL1*b* to BL3*b* and uses the values "10, 12, 10" obtained by the division as compression ratios with respect to the X direction for the respective blocks BL1*a* to BL3*a* for an item 51. This achieves similar operations to those described in the aforementioned tenth preferred embodiment in compressing the FBM 47*a*.

According to the failure analysis method of the eleventh preferred embodiment, the block sizes of the blocks BL1*a* to BL3*a* are described at the beginning of the recognition rule, instead of listing a plurality of values which directly indicate how to divide the number of bits in a single line of the FBM 47*a*. This, as compared with the aforementioned tenth preferred embodiment, simplifies the contents of description of the recognition rule.

Twelfth Preferred Embodiment

FIG. 36 is a diagram illustrating a recognition rule of a failure analysis method according to a twelfth preferred embodiment of the present invention. FIGS. 37A, 37B, 37C and 37D are diagrams respectively illustrating FBMs 53*a*, 53*b*, 56*a* and 56*d* in the failure analysis method according to the twelfth preferred embodiment.

The failure analysis method according to the twelfth preferred embodiment relates to improvements in the neighbor condition for use in judgment in the normal and multi-level recognition in the failure analysis methods according to the aforementioned first to third preferred embodiments.

Referring to FIG. 36, in the recognition rule according to the twelfth preferred embodiment, the item 22 regarding the neighbor condition is set to "Special". An item 52 is only effective when the item 22 is set to "Special". In the item 52, detailed neighbor conditions for upward and downward directions and right and left directions can individually be set to any one of "OK", "None" and "0–1". In the recognition rule shown in FIG. 36, as to the failure mode "A-line-Fail", a detailed neighbor condition for the upward direction, for example, is set to "0–1". This means that, in failure recognition based on the compressed FBM, if the number of defective pixels adjacent to a specific line of defective pixels with respect to the upward direction is in the range of 0 to 1, that defective pixel line is recognized as a line failure in the failure mode "A-line-Fail", whereas if the above number of defective pixels is out of range, the defective pixel line is not recognized as a line failure in the failure mode "A-line-Fail".

Figure 37A:
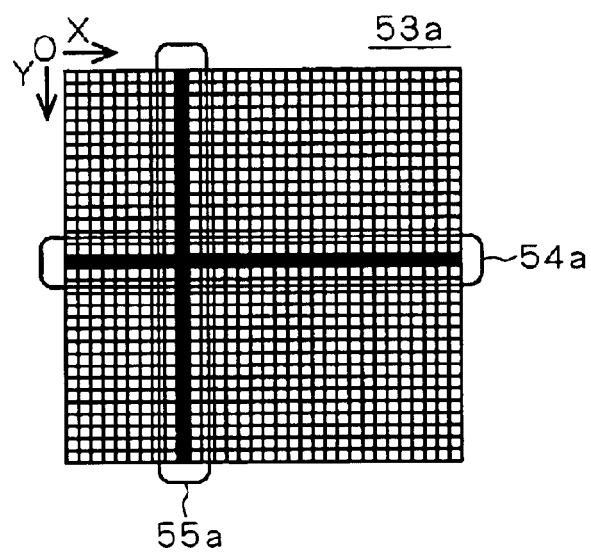
FIGS. 37A to 37D are diagrams illustrating FBMs in the failure analysis method according to the twelfth preferred embodiment of the present invention.

Referring to FIG. 37A, the original FBM 53*a* contains a line failure 54*a* extending along the X direction, and a line failure 55*a* extending along the Y direction and intersecting with the line failure 54*a*. By compressing the FBM 53*a* based on the contents of the items 18 and 32 on the recognition rule shown in FIG. 36, the FBM 53*b* shown in FIG. 37C can be obtained. The FBM 53*b* contains a defective pixel line 54*b* corresponding to the line failure 54*a* and a defective pixel line 55*b* corresponding to the line failure 55*a*. The defective pixel lines 54*b* and 55*b* intersect with each other and share one pixel in the second column of the third line of the FBM 53*b*.

According to the recognition rule shown in FIG. 36, the EWS 1 judges whether the defective pixel line 54*b* corresponds to a line failure in the failure mode "A-line-Fail". In the present example, the detailed neighbor conditions of the item 52 for the upward and downward directions are set to "0–1". Thus, the EWS 1 recognizes the defective pixel line 54*b* as a line failure in the failure mode "A-line-Fail".

Figure 37B:
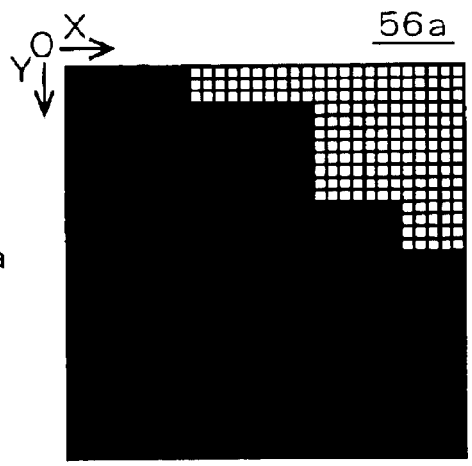
Figure 37C:
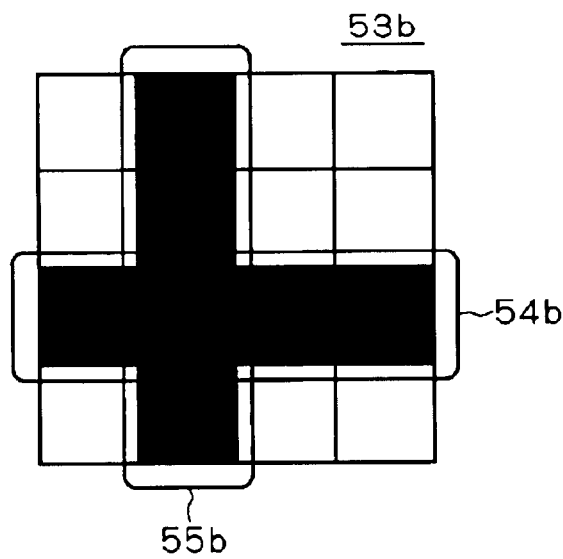
Figure 37D:
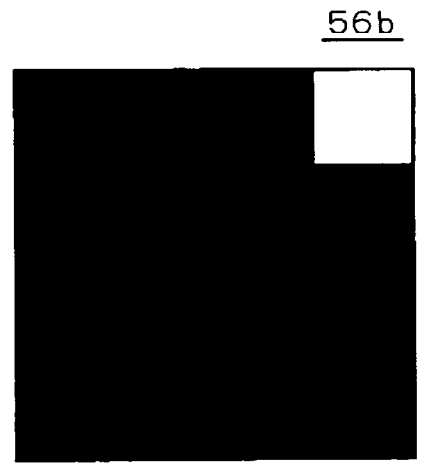

Now, the FBM 56*b* shown in FIG. 37D can be obtained by compressing the original FBM 56*a* shown in FIG. 37B. In the FBM 56*b*, however, no lines satisfy the detailed neighbor conditions for the upward and downward directions; therefore, no line failure is recognized in the failure mode "A-line-Fail".

According to the failure analysis method according to the twelfth preferred embodiment, the accuracy of failure recognition can be improved by individually setting the detailed neighbor conditions for the upward and downward directions and right and left directions. In the FBM 53*a*, for example, the line failure 54*a* and 55*a* intersecting with each other can be recognized properly.

Thirteenth Preferred Embodiment

Figure 38A:
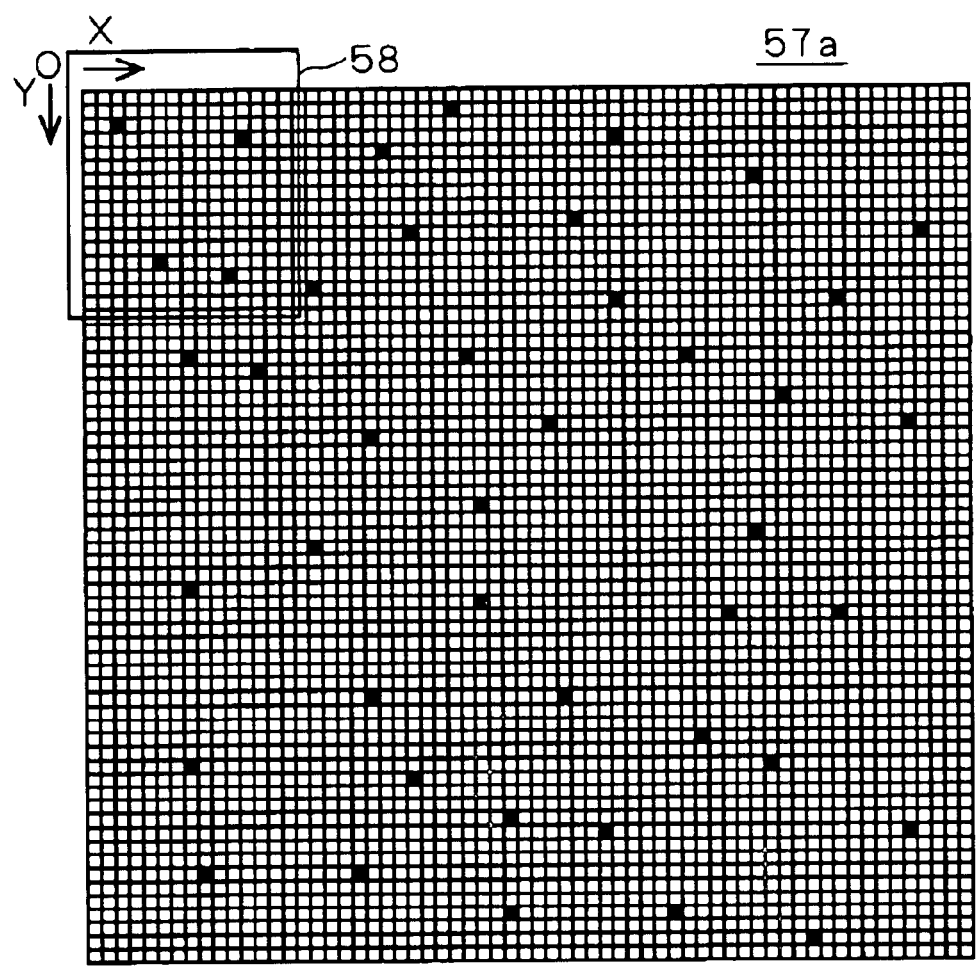
FIGS. 38A and 38B are diagrams illustrating FBMs in a failure analysis method according to a thirteenth preferred embodiment of the present invention.
Figure 38B:
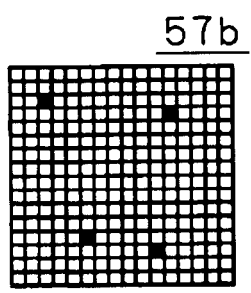

FIGS. 38A and 38B are diagrams respectively illustrating FBMs 57*a* and 57*b* in a failure analysis method according to a thirteenth preferred embodiment of the present invention.

Based on the result of a test on a memory LSI using the LSI tester 2, the original FBM 57*a* shown in FIG. 38A is generated. The FBM 57*a* has a pattern in which 4096 (64×64) bits are arranged in a matrix in correspondence with the pattern of a memory cell array. In the FBM 57*a*, bit failures are frequently observed.

The EWS 1 extracts part of the FBM 57*a* to generate a new FBM, which is then registered in the database 4. In the present example, a 16- by 16-bit area 58 including the origin point O is extracted from the FBM 57*a* to generate the FBM 57*b* shown in FIG. 38B. The EWS 1, based on the FBM 57*b*, executes the failure analysis methods according to the aforementioned first through twelfth preferred embodiments.

According to the failure analysis method of the thirteenth preferred embodiment, after the generation of the original FBM 57*a*, part of the FBM 57*a* or the area 58 is extracted to generate a new FBM 57*b* other than the FBM 57*a*. Thus, even if there is a massive amount of data to be processed by the EWS 1 for reasons such as a large size of the FBM 57*a* or frequent occurrence of failures in the FBM 57*a*, only the FBM 57*b* as a representative is subjected to failure analysis. This reduces the amount of data to be processed and improves the efficiency of failure analysis.

Fourteenth Preferred Embodiment

Figure 40A:
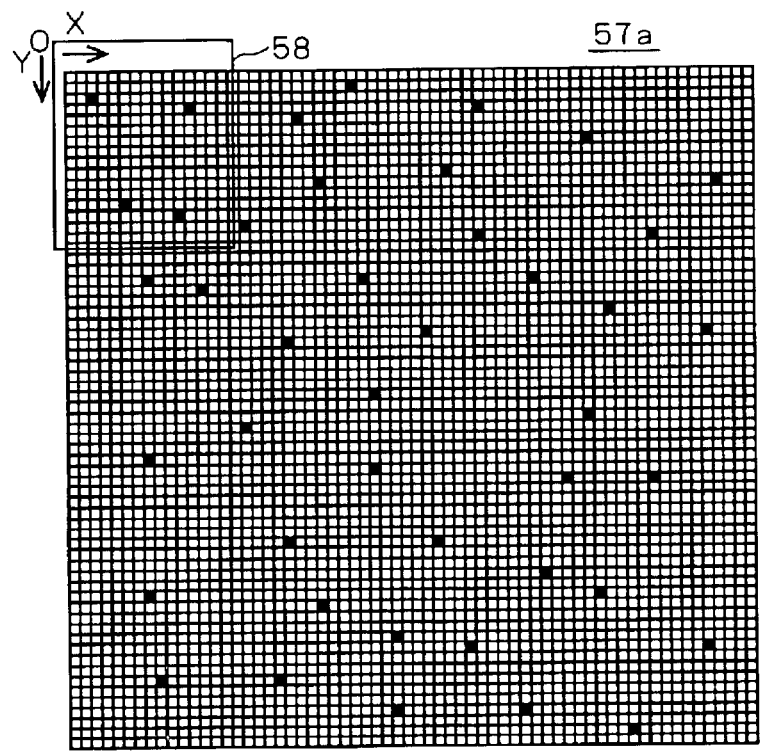
FIGS. 40A and 40B are diagrams illustrating FBMs in the failure analysis method according to the fourteenth preferred embodiment of the present invention.
Figure 40B:
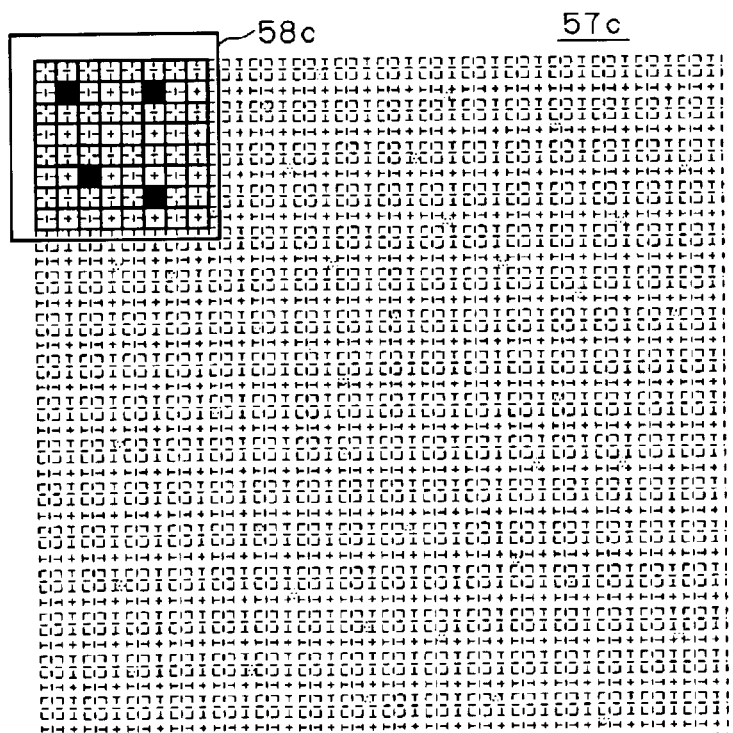

FIG. 39 is a diagram illustrating a recognition rule of a failure analysis method according to a fourteenth preferred embodiment of the present invention. FIGS. 40A and 40B are diagrams respectively illustrating FBMs 57*a* and 57*c* in the failure analysis method according to the fourteenth preferred embodiment. As in the aforementioned thirteenth preferred embodiment, the original FBM 57*a* shown in FIG. 40A is generated based on the result of a test on a memory LSI using the LSI tester 2. The FBM 57*a* has been registered in the database 4.

The EWS 1, based on the contents of items 59 and 60 on the recognition rule shown in FIG. 39, determines part of the FBM 57*a* to be subjected to the recognition process. In the present example, the 16- by 16-bit area 58 including the origin point O is determined. The area 58 can be set at any size by the item 59 on the recognition rule shown in FIG. 39 and can be set at any location by the item 60. The EWS 1 executes the failure analysis methods according to the aforementioned first through twelfth preferred embodiments only on the area 58. For example, the FBM 57*a* is compressed with 2×2 bits per pixel according to the recognition rule shown in FIG. 39, to generate the FBM 57*c* shown in FIG. 40B. In the FBM 57*c*, not the whole but only an area 58*c* corresponding to the area 58 is compressed.

According to the failure analysis method according to the fourteenth preferred embodiment, after the generation of the original FBM 57*a*, failure analysis is performed on only part of the FBM 57*a*, the area 58. Thus, even if there is a massive amount of data to be processed by the EWS 1, only the area 58 as a representative is subjected to failure analysis. This reduces the amount of data to be processed and improves the efficiency of failure analysis.

While the invention has been shown and described in detail, the foregoing description is in all aspects illustrative and not restrictive. It is therefore understood that numerous modifications and variations can be devised without departing from the scope of the invention.

What is claimed is:

1. A failure analysis method comprising the steps of:
   (a) generating a first FBM (Fail Bit Map) having a pattern in which a plurality of bits are arranged in a matrix, based on a result of a predetermined test on an object to be tested;
   (b) generating a second FBM by compressing said first FBM with a first compression ratio;
   (c) determining an area where a failure bit exists in said first FBM, based on said second FBM;
   (d) generating a third FBM by compressing a portion of said first FBM which corresponds to said area, with a second compression ratio lower than said first compression ratio; and
   (e) determining said failure bit based on said third FBM.

2. The failure analysis method according to claim 1, further comprising the step of:
   (f) obtaining a total number of failure bits existing in said first FBM, wherein
   said step (e) includes the step of (e-1) determining said failure bits existing in said first FBM in sequence by scanning a plurality of pixels in said third FBM, and
   scanning in said step (e-1) is terminated at a time when a cumulative total of said failure bits determined in sequence in said step (e-1) reaches said total number obtained in said step (f).

3. The failure analysis method according to claim 1, wherein
   in said step (c), said area is determined by scanning said second FBM, considering a plurality of pixels as a unit of scanning, and
   the number of pixels in said unit of scanning is variable for each scanning step in said step (c).

4. The failure analysis method according to claim 1, wherein
   in said step (b), said first compression ratio is variable for each location in said first FBM.

5. The failure analysis method according to claim 1, wherein
   said step (c) includes the step of (c-1) judging whether a defective pixel existing in said second FBM corresponds to a failure in a specific failure mode,
   said step (c-1) is to judge whether said defective pixel satisfies a first neighbor condition concerning non-defective/defective conditions of pixels adjacent to said defective pixel with respect to a first direction, and a second neighbor condition concerning non-defective/defective conditions of pixels adjacent to said defective pixel with respect to a second direction different from said first direction, and
   said first and second neighbor conditions can be set separately.

6. The failure analysis method according to claim 1, wherein said step (e) includes the step of (e-1) judging whether a defective pixel existing in said third FBM corresponds to a failure in a specific failure mode, said step (e-1) is to judge whether said defective pixel satisfies a first neighbor condition concerning non-defective/defective conditions of pixels adjacent to said defective pixel with respect to a first direction, and a second neighbor condition concerning non-defective/defective conditions of pixels adjacent to said defective pixel with respect to a second direction different from said first direction, and said first and second neighbor conditions can be set separately.

7. The failure analysis method according to claim 1, wherein said step (a) includes the steps of (a-1) generating an original FBM by conducting said predetermined test on said object to be tested; and (a-2) generating said first FBM by extracting part of said original FBM as another new FBM than said original FBM.

8. The failure analysis method according to claim 1, wherein said step (a) includes the step of (a-1) generating an original FBM by conducting said predetermined test on said object to be tested, and said first FBM is part of said original FBM.

9. A failure analysis method comprising the steps of (a) generating a first FBM (Fail Bit Map) having a pattern in which a plurality of bits are arranged in a matrix, based on a result of a predetermined test on an object to be tested;

(b) generating a second FBM having a first pattern by compressing said first FRM;

(c) generating a third FBM having a second pattern different from said first pattern, by compressing said first FBM;

(d) determining a first failure based on said second FBM; and (e) determining a second failure based on said third FBM.

10. The failure analysis method according to claim 9, further comprising the step of:

(f) obtaining a total number of failure bits existing in said first FBM, wherein said step (d) includes the step of (d-1) determining said first failure existing in said first FBM in sequence by scanning a plurality of pixels in said second FBM said step (e) includes the step of (e-1) determining said second failure existing in said first FBM in sequence by scanning a plurality of pixels in said third FBM, and scanning in said steps (d-1) and (e-1) is terminated at a time when a cumulative total of the number of failure bits forming said first failure determined in sequence in said step (d-1) and the number of failure bits forming said second failure determined in sequence in said step (e-1) reaches said total number obtained in said step (f).

11. The failure analysis method according to claim 9, wherein said step (b) includes the steps of:

(b-1) generating a fourth FBM by compressing said first FBM; and (b-2) generating said second FBM by compressing said fourth FBM, a bit group consisting of a plurality of consecutive bits belonging in the same line of said first FBM corresponds to one pixel in said fourth FBM, a pixel group consisting of a plurality of consecutive pixels belonging in the same line of said fourth FBM corresponds to one pixel in said second FBM, in said fourth FBM, a pixel which corresponds to said bit group containing not less than a predetermined number of failure bits is set as a defective pixel, and in said second FBM, a pixel which corresponds to said pixel group containing not less than a predetermined number of said defective pixels is set as a defective pixel.

12. The failure analysis method according to claim 9, wherein said step (e) includes the step of (e-1) judging whether a defective pixel existing in said third FBM corresponds to a failure in a specific failure mode, said step (e-1) is to judge whether said defective pixel satisfies a first neighbor condition concerning non-defective/defective conditions of pixels adjacent to said defective pixel with respect to a first direction, and a second neighbor condition concerning non-defective/defective conditions of pixels adjacent to said defective pixel with respect to a second direction different from said first direction, and said first and second neighbor conditions can be set separately.

13. The failure analysis method according to claim 9, wherein said step (d) includes the step of (d-1) judging whether a defective pixel existing in said second FBM corresponds to a failure in a specific failure mode, said step (d-1) is to judge whether said defective pixel satisfies a first neighbor condition concerning non-defective/defective conditions of pixels adjacent to said defective pixel with respect to a first direction, and a second neighbor condition concerning non-defective/defective conditions of pixels adjacent to said defective pixel with respect to a second direction different from said first direction, and said first and second neighbor conditions can be set separately.

14. The failure analysis method according to claim 9, wherein said step (a) includes the steps of:

(a-1) generating an original FBM by conducting said predetermined test on said object to be tested; and (a-2) generating said first FBM by extracting part of said original FBM as another new FBM than said original FBM.

15. The failure analysis method according to claim 9, wherein said step (a) includes the step of (a-1) generating an original FBM by conducting said predetermined test on said object to be tested, and said first FBM is part of said original FBM.

16. The failure analysis method according to claim 9, wherein each of the first, second, and third FBMs represents the same memory cells of the object.

* * * * *